United States Patent [19]

Korikawa et al.

[11] Patent Number: 5,570,269
[45] Date of Patent: Oct. 29, 1996

[54] MAGNETIC DISK MODULE

[75] Inventors: Masayuki Korikawa; Toru Shinohara; Masahito Iwatsubo; Saori Yokoyama; Hideki Ohmori; Takasi Watanabe; Tsuneo Ohsugi, all of Kawasaki, Japan

[73] Assignee: Fujitsu Limited, Japan

[21] Appl. No.: 268,503

[22] Filed: Jun. 30, 1994

[30] Foreign Application Priority Data

Oct. 5, 1993 [JP] Japan .................. 5-249436

[51] Int. Cl.⁶ .............. G06F 1/16; H05K 5/00; H01R 9/00
[52] U.S. Cl. ............... 361/685; 361/695; 361/790; 360/97.03; 439/61
[58] Field of Search ...................... 361/683–687, 361/724, 728–730, 733, 825, 790; 360/97.01–97.03; 439/61–64, 928.1

[56] References Cited

U.S. PATENT DOCUMENTS

| 4,926,291 | 5/1990 | Sarraf | 361/685 |
| 5,115,663 | 10/1992 | Harase | 361/395 |
| 5,206,772 | 4/1993 | Hirawo et al. | |
| 5,418,775 | 5/1995 | Okatani | 369/275.5 |

FOREIGN PATENT DOCUMENTS

| 0488679 | 11/1991 | European Pat. Off. |
| 0584979 | 8/1993 | European Pat. Off. |
| 4259980 | 8/1992 | Japan |
| 4214288 | 9/1992 | Japan |
| 4275095 | 9/1992 | Japan |

*Primary Examiner*—Michael W. Phillips
*Assistant Examiner*—Jayprakash N. Gandhi
*Attorney, Agent, or Firm*—Greer, Burns & Crain, Ltd.

[57] ABSTRACT

A magnetic disk module adapted to be inserted in a data storing device body which is in use. The module includes two sets of disk drive units and printed wiring boards in one housing so that are disk drive unit or printed wiring board can be easily attached or detached in one set while the other set is in an operating state. The module includes a first connector attached to the disk drive unit, a second connector attached to the printed wiring board, a third connector at the rear end of the housing for plug-in connection to a connector of a data storing device body, a fourth connector arranged in the housing for plug-in connection to the first connector, and a fifth connector arranged in the housing for plug-in connection to the second connector.

25 Claims, 21 Drawing Sheets

MAGNETIC DISK MODULE

BACKGROUND OF THE INVENTION

1. Field of the Invention

The present invention relates to a magnetic disk module adapted to be inserted in a data storing device body which is in use.

2. Description of the Related Art

A typical magnetic disk device used as an external data storing device for a computer comprises a cabinet defining a plurality of shelves, and magnetic disk modules accommodated in the shelves. The magnetic disk module comprises a disk drive unit, accommodating magnetic disks and a head assembly, a printed wiring board controlling the disk drive unit, a power supply unit, and a housing to accommodate these components.

A connector is arranged at the rear of the housing to make a plug-in connection to a mating connector the shelf when the magnetic disk module is inserted into the cabinet shelf. The entire magnetic disk module can be removed from the cabinet shelf to replace the disk drive unit, the printed wiring board or other parts. Such a cabinet and a magnetic disk module are disclosed, for example, in Japanese Unexamined Patent Publications (Kokai) No. 4-275095, No. 4-214288 and No. 4-259980.

With the recent tendency to increase the size of computer systems, magnetic disk devices are required to have larger capacity, while the size of the device is required to be smaller. To satisfy such contradictory requirements, a magnetic disk module having two disk drive units and two printed wiring boards for controlling the disk drive units, in the one housing, has been proposed. For example, it is possible to construct a magnetic disk module containing two sets of 5 inch magnetic disk drives and printed wiring boards, such that the magnetic disk module is the same size as the conventional magnetic disk module containing one 8 inch magnetic disk drive and one printed wiring board. The magnetic disk module having two 5 inch magnetic disk drives can be used in the conventional magnetic disk device, and can satisfy the requirement for a larger capacity without increasing the size of the device.

In addition, it is also required to reduce the time necessary for the replacement or the repair of a disk drive unit or a printed wiring board for controlling the former, in order to minimize the effect of a failure on the operation of the computer system. In the conventional magnetic disk module, the entire magnetic disk module is removed from the cabinet shelf when the replacement or repair of the disk drive unit or the printed wiring board is necessary.

In the magnetic disk module having two sets of disk drive units and printed boards for controlling the units in one housing, supposing that one of the disk drive units or printed boards is abnormal but the other disk drive unit or printed board is normal, it is possible to minimize the effect on operation of the computer system if the abnormal unit is detachable from the housing while keeping the other operative, compared with the case in which both sets must be detached from the housing. However, in the conventional magnetic disk module, the disk drive unit and its controlling printed wiring board are fixed to the housing by screws and connected to connectors at the power supply unit and the rear end of the case, respectively, through cables, so it is difficult to remove the disk drive unit and its controlling printed wiring board from the housing and the above requirement is not be satisfied.

SUMMARY OF THE INVENTION

An object of the invention is to provide a magnetic disk module in which a disk drive unit or a printed wiring board can be easily attached to or detached from a housing thereof.

Another object of the present invention is to provide a magnetic disk module having a plurality of sets of disk drive units and printed wiring boards.

A further object of the present invention is to provide a magnetic disk module including two sets of disk drive units and printed boards in which one disk drive unit or printed board can be easily detached, while keeping the other disk drive unit and printed wiring board in the operative condition.

A still further object of the present invention is to provide a magnetic disk module including cooling fans having a reliable cooling performance.

A still further object of the present invention is to provide a printed wiring board assembly which can be used for a magnetic disk module or the like and has an additional printed wiring boards with terminals projecting from the outer surface thereof.

According to the present invention, there is provided a magnetic disk module adapted to be inserted in a data storing device body in use, said module comprising: a housing having a front end and a rear end; at least one disk drive unit accommodated in the housing and having a first connector; at least one printed wiring board accommodated in the housing for controlling the at least one disk drive unit and having a second connector; a power supply unit accommodated in the housing; a third connector arranged at the rear end of the housing for plug-in connection to a connector of a data storing device body when the magnetic disk module is inserted into the data storing device body; a fourth connector arranged in the housing for plug-in connection to the first connector when the disk drive unit is inserted in the housing; and a fifth connector arranged in the housing for plug-in connection to the second connector when the printed wiring board is inserted in the housing.

In this magnetic disk module, the connector of the housing is used for plug-in connection of the module to the data storing device body, and at least one disk drive unit or at least one printed wiring board can be easily detached from and attached to the housing by the plug-in connection between the connectors. Therefore, for example, if two sets of disk drive units and printed wiring boards are included in one module, it is possible to detach a disk drive unit or printed wiring board of one set from the module, with the connector of the housing remaining connected to the connector of the data storing device body and the connectors of the disk drive unit and printed wiring board of the other set remaining connected to the connectors of the housing.

In addition, the printed wiring board assembly according to the present invention comprises a first printed wiring board, a second printed wiring board attached to the first printed wiring board, and a bent plate member for mounting the second printed wiring board to the first printed wiring board, the second printed wiring board having an outer surface, and terminals projecting from the outer surface of the additional printed wiring board in the condition where the additional printed board is mounted to the first printed wiring board, the second printed wiring board being fixed to the plate member by screws so that heads of the screws protrude higher than the terminals.

This printed wiring board assembly can be used for the above magnetic disk module or the like. The printed wiring board assembly includes the second printed wiring board attached to the first printed wiring board. The second printed wiring board has terminals projecting from the outer surface thereof. The second printed wiring board is fixed to the plate member by screws, so that heads thereof protrude higher than the terminals. Therefore, when the second printed wiring board is detached from the first printed wiring board and placed on a flat conductor, it is possible to prevent the terminals from contacting the flat conductor and a formation of a short-circuit can be avoided.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
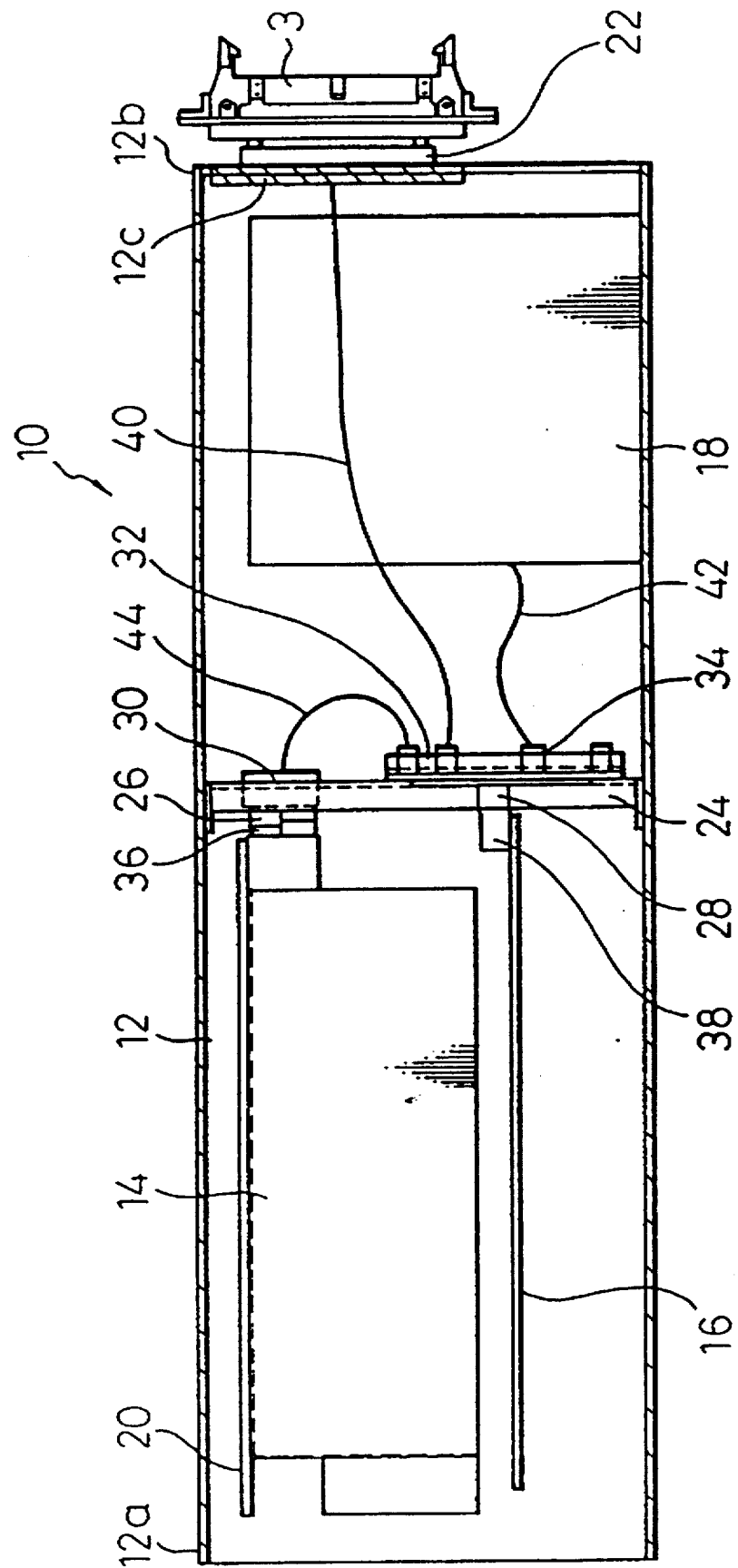
FIG. 1 is a cross-sectional plan view of the magnetic disk module according to the first embodiment of the present invention.

FIG. 1 is a cross-sectional plan view of the magnetic disk module 10 according to the first embodiment of the present invention. The magnetic disk module 10 comprises a housing 12 having a front end 12a and a rear end 12b, a disk drive unit 14 accommodated in the housing 12, a printed wiring board 16 accommodated in the housing 12 for controlling the disk drive unit 14, and a power supply unit 18. In addition, another printed wiring board 20 is fixed to the disk drive unit 14.

The front end 12a of the housing 12 is open, so that the disk drive unit 14 and the printed wiring board 16 can be inserted in or removed from the housing 12 through the front end 12a. A connector 22 is arranged on an end wall 12c at the rear end 12b of the housing 12. The connector 22 can be connected to a connector 3 of the data storing device body (see FIG. 11) by a plug-in connection.

A mother board 24 acting as a supporting plate is arranged in the housing 12, transversely to the longitudinal axis of the housing 12. The disk drive unit 14 and the printed wiring board 16 are located on the front side of the mother board 24, while the power supply unit 18 is located on the rear side. The mother board 24 has connectors 26 and 28 on the front surface thereof and connectors 30, 32 and 34 on the rear surface thereof.

A connector 36 is provided at the rear end of the disk drive unit 14 and is capable of making the plug-in connection to the connector 26 of the mother board 24. A connector 38 is provided at the rear end of the printed wiring board 16 and is capable of making the plug-in connection to the connector 28 of the mother board 24. The connectors 32 and 34 on the rear surface of the mother board 24 are connected to cables 40 and 42, respectively, which are connected to the connector 22 and the power supply unit 18. A cable 44 interconnects the connectors 30 and 32.

According to this arrangement, it is possible to promptly carry out the replacement or repair of the components of the magnetic disk module 10, by detaching the disk drive unit 14 or the printed wiring board 16 from the housing 12 with the connector 22 of the housing 12 remaining connected to the connector 3 of the data storing device body.

Figure 9:
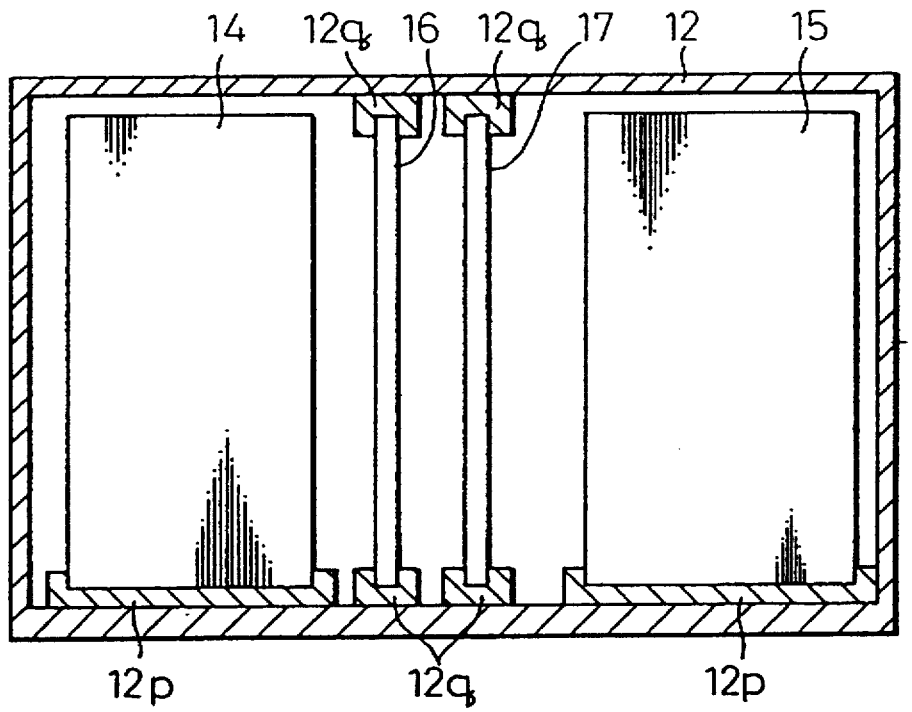
FIG. 9 is a cross-sectional view of the disk drive unit shown in FIG. 2.
Figure 10:
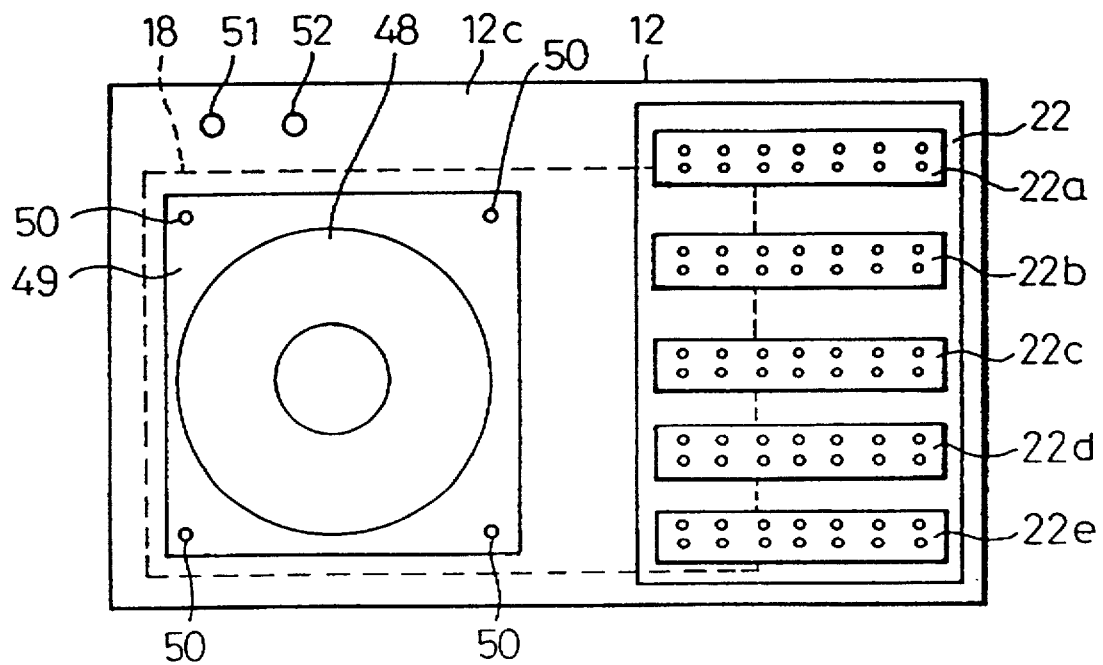
FIG. 10 is a rear end view of the magnetic disk module of FIG. 2.
Figure 11:
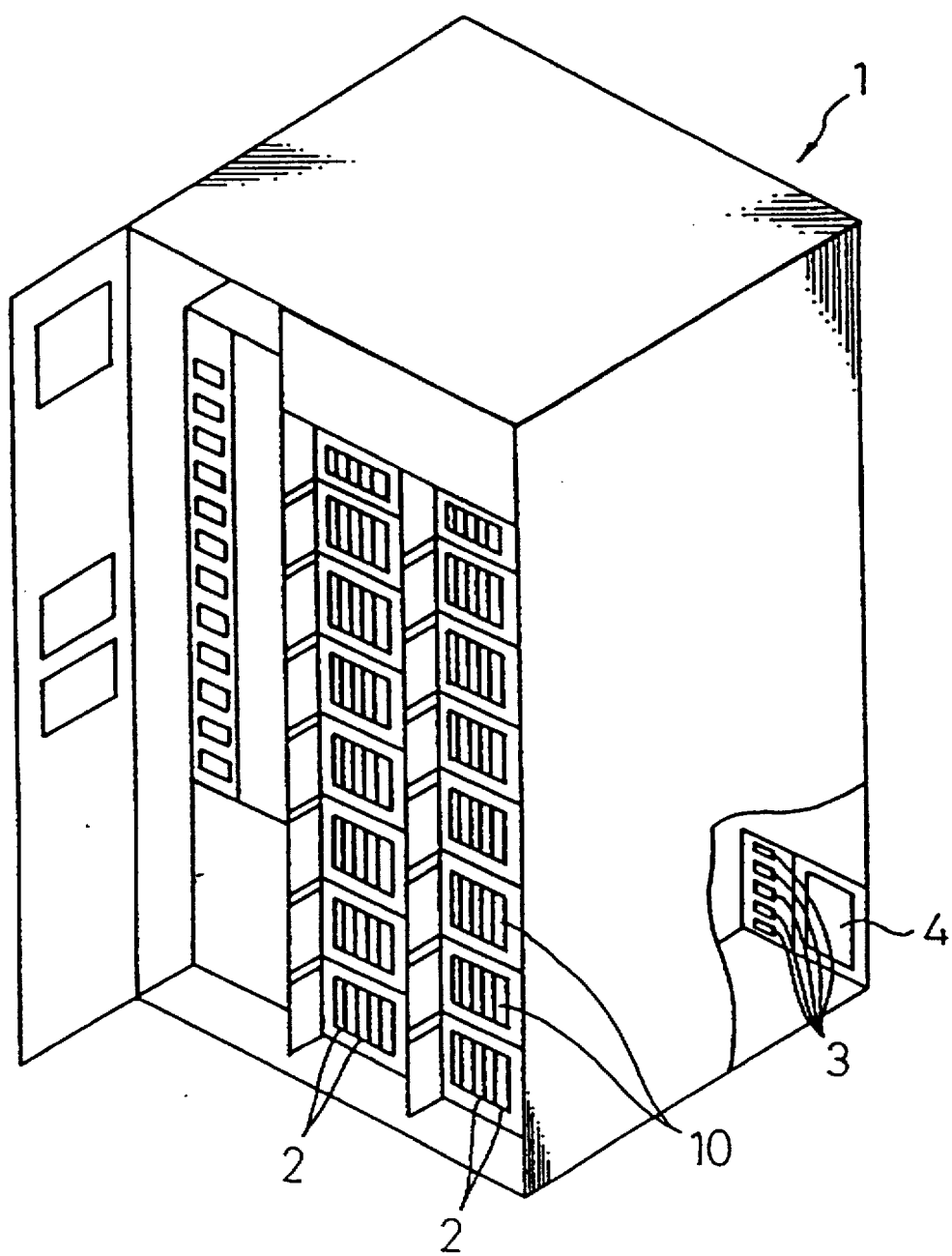
FIG. 11 is a perspective view of the magnetic disk device in which the magnetic disk module is inserted and used.

FIGS. 2 to 10 illustrate a magnetic disk module 10 according to the second embodiment of the present invention, and FIG. 11 illustrates a cabinet 1 as a body of a magnetic disk data storing device. The cabinet 1 has a plurality of shelves 2, so that the magnetic disk module 10 is inserted in each of the shelves 2 in use. A connector 3 is provided at the rear end of each of the shelves 2 for plug-in connection to a connector 22 provided at the rear end of a housing 12 of the magnetic disk module 10. An opening 4 is provided in the rear end wall of the cabinet 1 in a side-by-side relationship with the connector 3.

Figure 2:
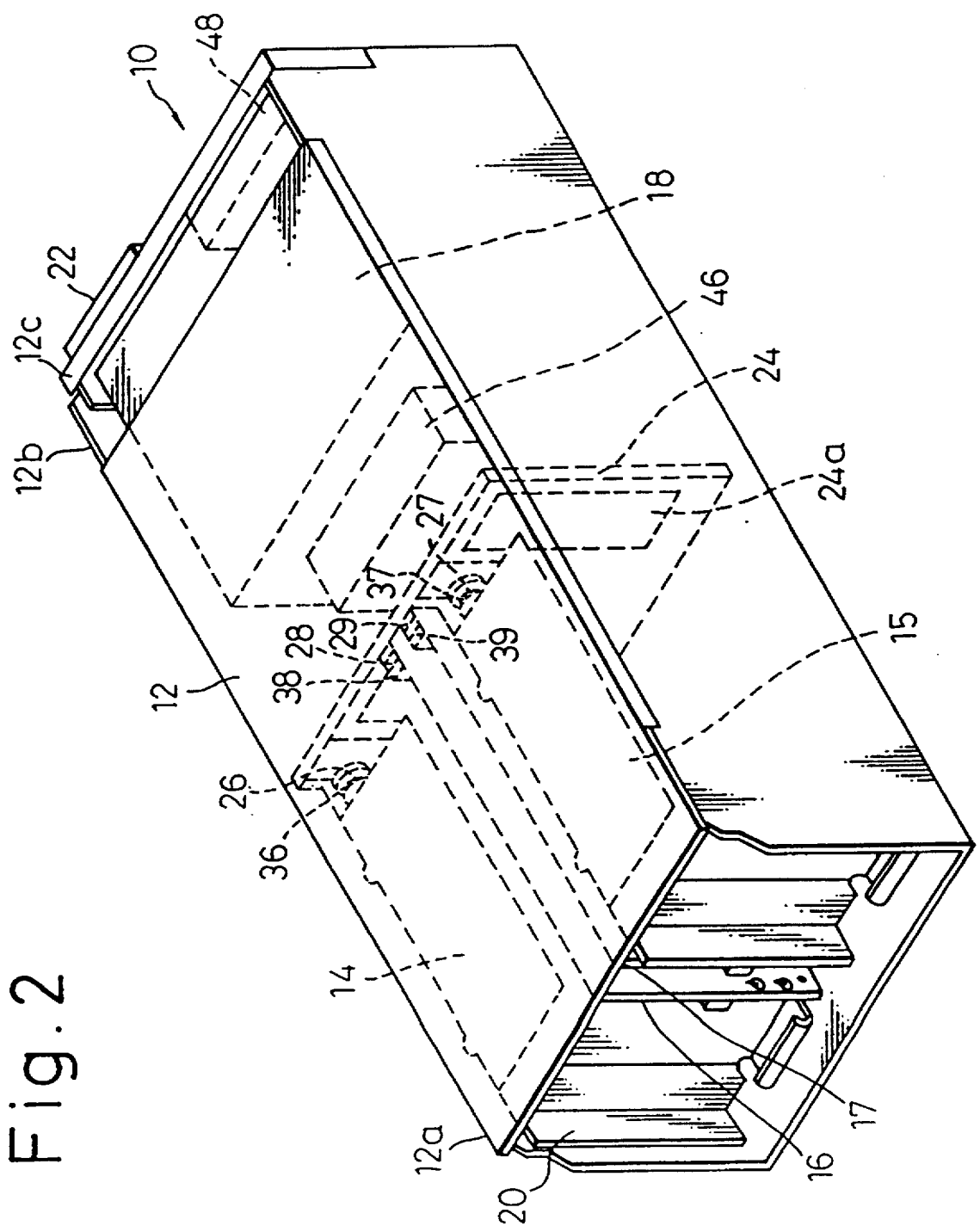
FIG. 2 is a perspective view of the magnetic disk module according to the second embodiment of the present invention.

In FIG. 2, the magnetic disk module 10 comprises a housing 12 having a front end 12a and a rear end 12b, two disk drive units 14 and 15 accommodated in the housing 12, two printed wiring boards 16 and 17 accommodated in the housing 12 for controlling the respective disk drive units 14, 15, and a power supply unit 18. Further, another printed wiring board 20 is fixed to each of the disk drive units 14 and 15.

The front end 12a of the housing 12 is open, through which the disk drive units 14 and 15 and the printed wiring boards 16 and 17 can be inserted into or removed from the housing 12. Each of the disk drive units 14 and 15 is slidable along a guide plate 12p provided at the bottom of the housing 12, and each of the printed wiring boards 16 and 17 is slidable along a pair of guide grooves 12q provided at the top and the bottom of the housing 12, as shown in FIG. 9. A connector 22 is arranged on an end wall 12c at the rear end 12b of the housing 12. The connector 12 can be connected to the connector 3 of FIG. 11 by a plug-in connection. The connector 22 comprises five connector members 22a, 22b, 22c, 22d and 22e, as shown in FIG. 10.

A mother board 24 as a supporting plate is arranged in the housing 12 so as to extend transversely to the longitudinal axis of the housing 12. The disk drive units 14 and 15 and the printed wiring boards 16 and 17 are located on the front side of the mother board 24 and extend in the longitudinal direction of the housing 12 in parallel to each other. The power supply unit 18 is located on the rear side of the mother board 24.

Figure 3:
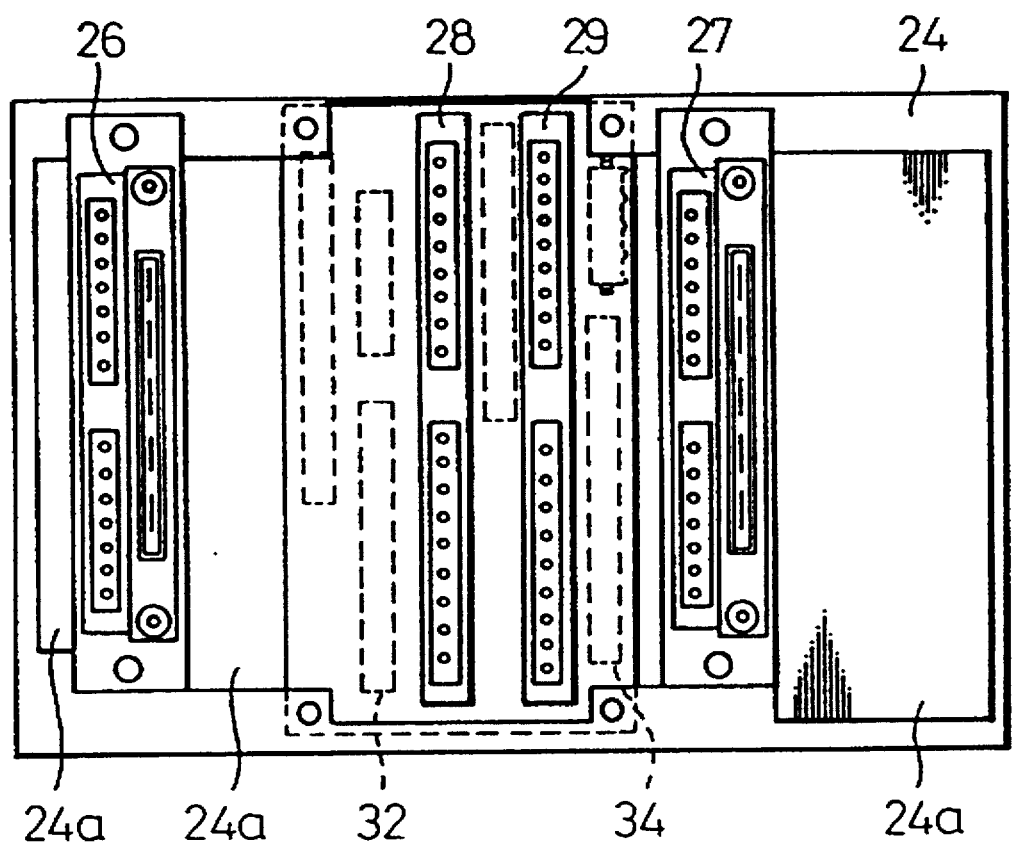
FIG. 3 is a front view of the mother board of FIG. 2.

As shown in FIGS. 2 and 3, the mother board 24 has connectors 26, 27, 28 and 29 on the front surface thereof and connectors 32 and 34 on the rear surface thereof. Cables (for example, cables 40 and 42 in FIG. 1) interconnect the rear surface connectors 32 and 34 to the connector 22 and the power supply unit 18. Other suitable connectors may be provided on the rear surface of the mother board 24.

A connector 36 or 37 is arranged at the rear end of each of the disk drive units 14 and 15, the connector 36 or 37 being connected to the connector 26 or 27 on the mother board 24 by a plug-in connection. A connector 38 or 39 is arranged at the rear end of each of the printed wiring boards 16 and 17, the connector 38 or 39 being connected to the connector 28 or 29 on the mother board 24 by a plug-in connection.

Further, the mother board 24 is mechanically connected to the side walls, the top wall and the bottom wall of the housing 12. The mother board 24 has an opening 24a for allowing cooling air to pass therethrough.

As shown in FIG. 2, a cooling fan 46 is arranged at a position on the rear side of the mother board 24 and on the front side of the power supply unit 18, and another cooling fan 48 is arranged on the rear side of the power supply unit 18. In FIG. 10, the cooling fan 48 is arranged adjacent to the end wall 12c at the rear end 12b of the housing 12 and secured to the end wall 12c by a supporting frame 49. The cooling fan 48 is detachable from the rear end of the housing 12 together with the supporting frame 49 by loosening screws 50. In addition, two enable/disable switches 51, 52 are secured on the end wall 12c at the rear end 12b of the housing 12, as shown in FIG. 10.

Figure 4:
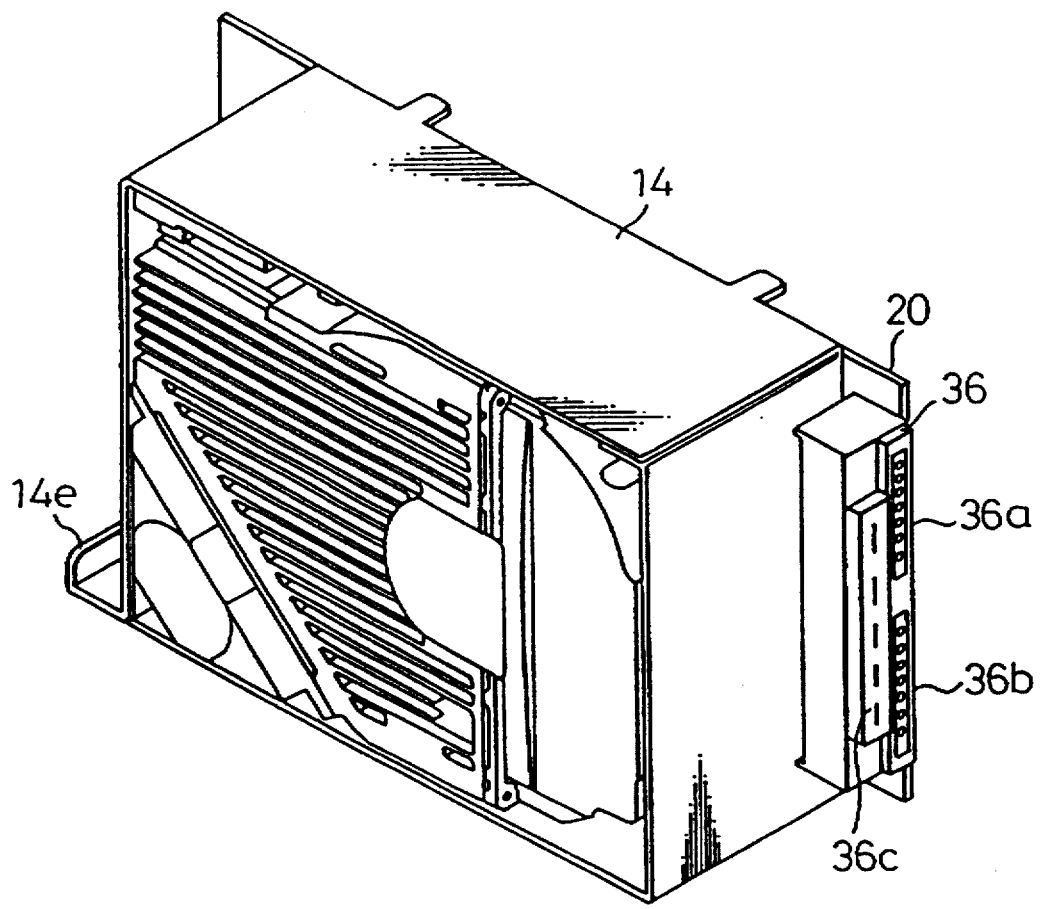
FIG. 4 is a perspective view of the disk drive unit of FIG. 2.
Figure 5:
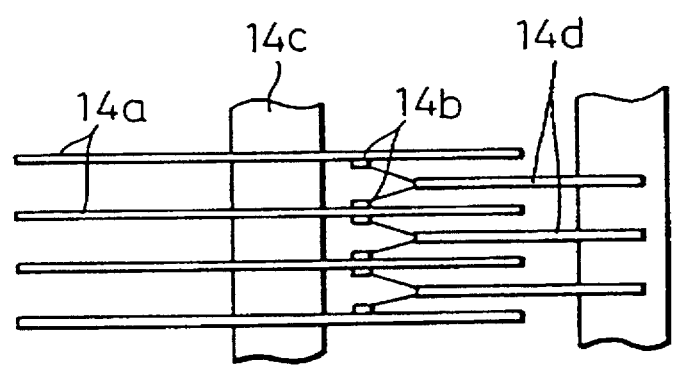
FIG. 5 is a front view of magnetic disks and magnetic heads.

FIG. 4 is a perspective view illustrating the disk drive unit 14. In this regard, another disk drive unit 15 is of the same structure. As shown in FIG. 5, the disk drive unit 14 has a plurality of magnetic disks 14a and a plurality of magnetic heads 14b for an access to the respective magnetic disks 14a, the disks 14a and the heads 14b being inserted in an enclosure. The magnetic disks 14a are secured to a shaft 14c and rotatable therewith, while the magnetic heads 14b are secured to actuator arms 14d.

Figure 6:
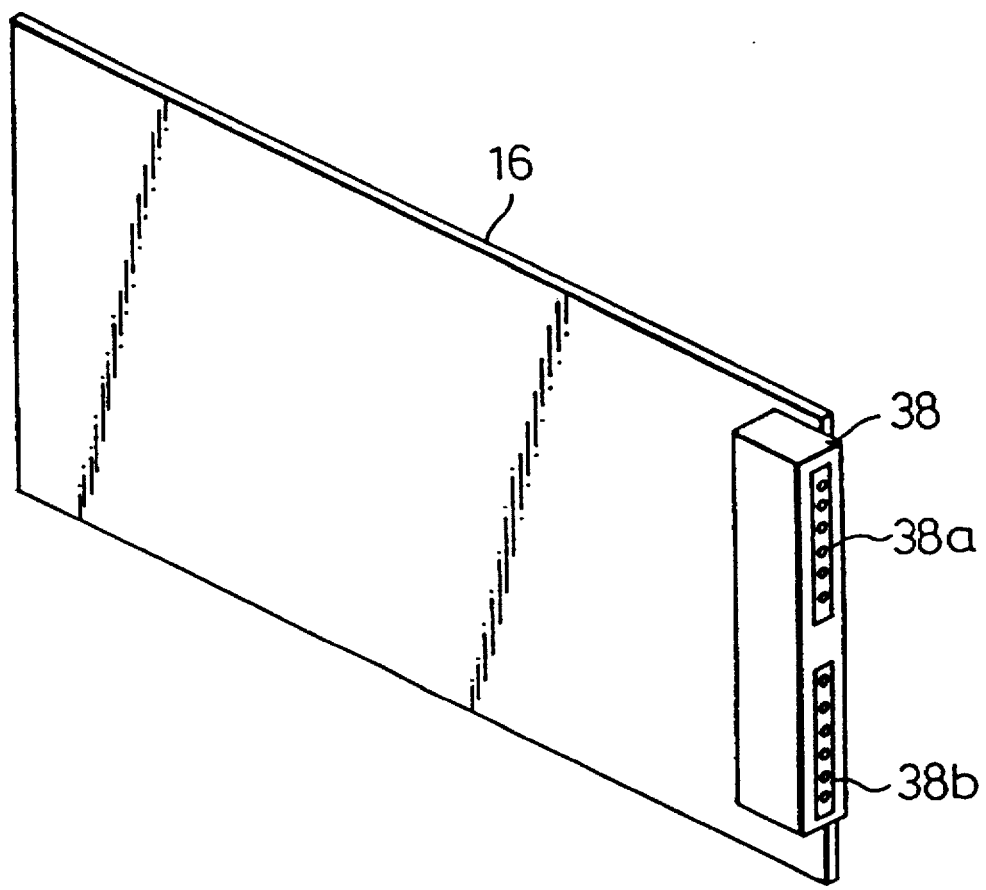
FIG. 6 is a perspective view of the printed wiring board of FIG. 2.

As shown in FIG. 4, a tab 14e is provided at the front end of the disk drive unit 14 for manually pushing or pulling the disk drive unit 14. The printed wiring board 20 is mounted to the side surface of the disk drive unit 14 and the connector 36 is mounted to the rear end of the disk drive unit 14. The connector 36 includes three connector members 36a, 36b and 36c FIG. 6 is a perspective view of the printed wiring board 16. Another printed wiring board 17 is of the same structure. The connector 38 is secured to the rear end of the printed wiring board 16. The connector 38 includes two connector members 38a and 38b.

Figure 7:
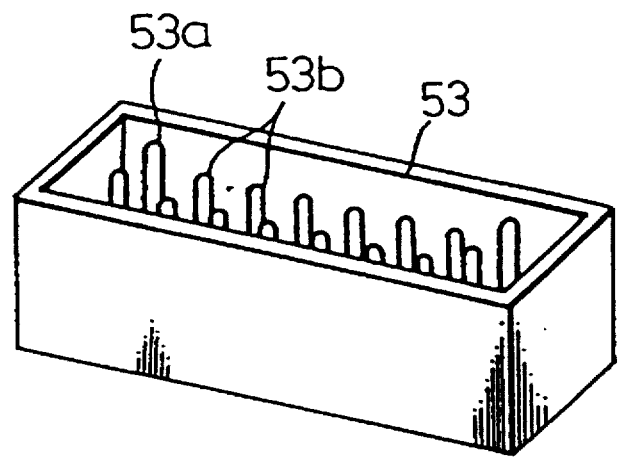
FIG. 7 is a perspective view of the male type connector.
Figure 8:
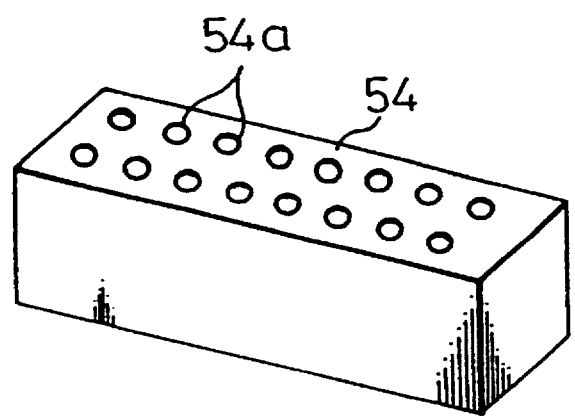
FIG. 8 is a view illustrating the female type connector.

As illustrated in FIGS. 7 and 8, the connector for the electric connection uses a pair of male and female connectors; the male connector 53 has projections such as pins or blades 53a and 53b and the female connectors 54 has recesses such as holes or slits 54a.

Accordingly, in the above described connector pairs 26–36, 27–37, 28–38, 29–39 and 22–3, one of the connector pair is the male connector 53 and the other is the female connector 54. Also, in the present invention, lengths of the projections 53a and 53b in the male connector 53 are different from each other so that a timing for connecting the power supply pin and a timing for connecting the signal pins are changed from each other. That is, in FIG. 7, the longer projection 53a is a terminal for the power supply or ground, while the shorter projections 53b are terminals for signal lines. Instead of changing the length of the projection of the male connector 53, it is possible to change the depth of the recess of the female connector 54.

In the above described arrangement, when one of the disk drive units or the printed circuit boards in two sets of disk drive units 14 and 15 and the printed wiring boards 16 and 17 fail, it is possible to detach the failing disk drive unit or the failing printed wiring board alone from the housing 12 while the housing 12 is remained in the cabinet 1 and the remaining non-broken disk drive unit(s) and the printed wiring board(s) remain in the operative condition. After the completion of repair, the detached component is again inserted into the housing 12 for use.

Figure 12:
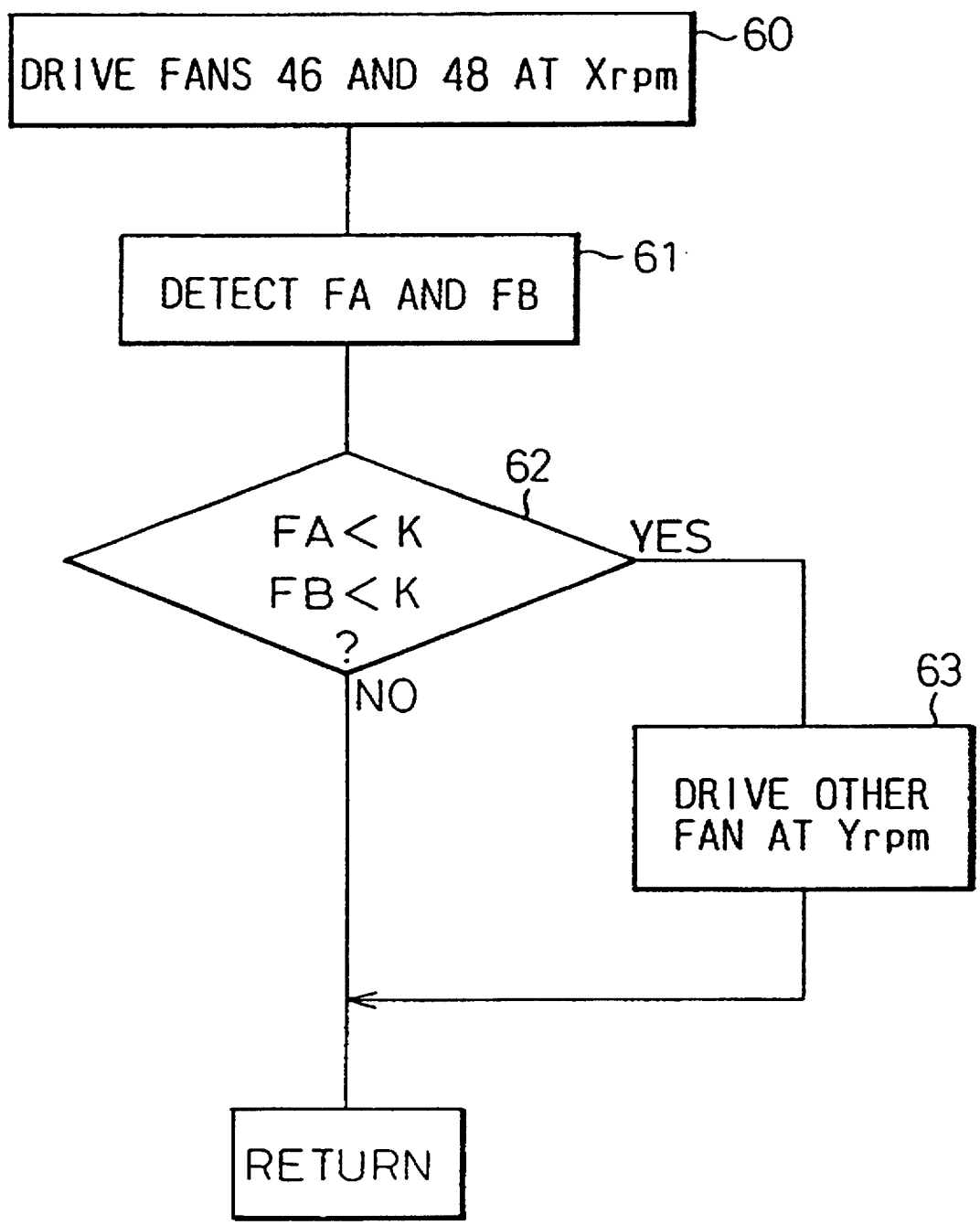
FIG. 12 is a flow chart for controlling two cooling fans.

FIG. 12 is a flow chart for controlling the cooling fans 46 and 48. As shown at step 60, the cooling fans 46, 48 are normally driven under the control of a controller (not shown) at a predetermined rotational speed X rpm. As shown at step 61, a rotational speed detection means (not shown) always detects the rotational speeds FA and FB of the cooling fans 46 and 48, respectively. As step 62, it is determined whether or not the rotational speed FA or FB of the cooling fan 46 or 48 is smaller than a certain value K, where K is a constant smaller than X. That is, the abnormality of either the cooling fan 46 or 48 is detected by the lowering of the rotational speed. If the result at step 62 in NO, the operation of the cooling fans continues.

On the other hand, if the result at step 62 is YES, the routine goes to step 63, whereby the cooling fan 46 or 48 operating at a normal speed is accelerated to Y rpm which is higher than X. Accordingly, if one of the cooling fans 46 and 48 becomes abnormal, it is possible to guarantee the cooling capacity, by increasing the rotational speed of the other cooling fan 48 or 46. In this case, it is not necessary to initially drive both the cooling fans 46 and 48 at the same rotational seed of X rpm.

This control is applicable not only to the above-described case in which two cooling fans are used, but also to other cases in which a plurality of cooling fans other than two are used. That is, in the latter case in which a number of cooling fans are provided in the housing 12 and normally driven at a predetermined rotational speed, if the rotational speed of a certain cooling fan is lowered to a certain value, it is possible to accelerate one or more of the remaining cooling fans to a higher rotational speed.

As shown in FIGS. 2 and 3, when the mother board 24 is mechanically connected to the side walls, and the top wall and the bottom wall of the housing 12 and two printed wiring boards 16, 17 extend in parallel to each other at a relatively small gap therebetween, cooling air can hardly pass through a space enclosed by the two printed wiring boards 16, 17 and the mother board 24. Accordingly, it is preferable to arrange the following air passage.

Figure 13:
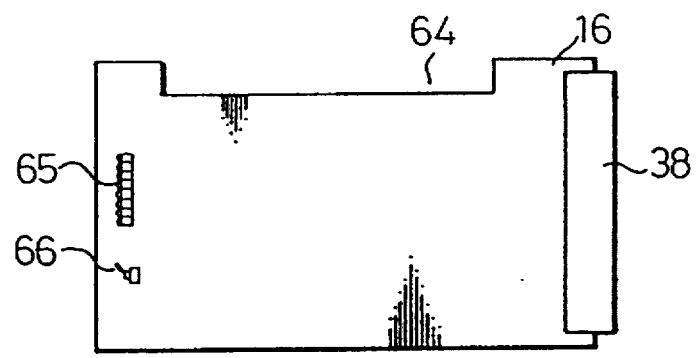
FIG. 13 is a side view of one example of the printed wiring board having a notch.
Figure 14:
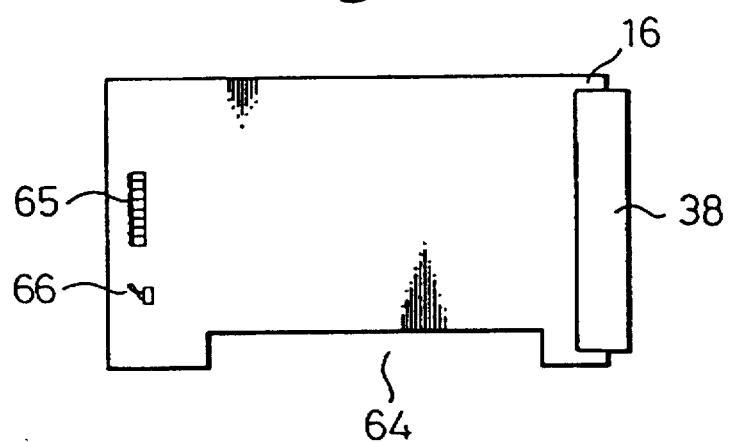
FIG. 14 is a side view of another example of the printed wiring board having a notch.
Figure 15:
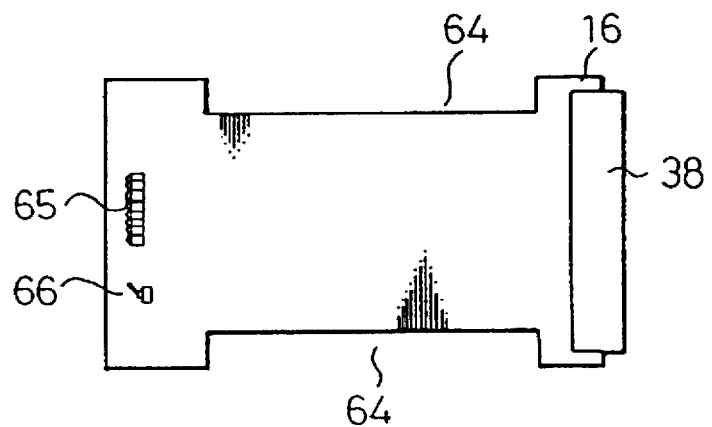
FIG. 15 is a side view of a further example of the printed wiring board having a notch.

FIGS. 13 through 15 show a printed wiring board 16 (17) having a cutout 64 for allowing a cooling air to pass therethrough.

In FIG. 13, the cutout 64 is formed on the top edge of the printed wiring board 16 (17). 10 In FIG. 14, the cutout 64 is formed on the bottom edge of the printed wiring board 16 (17).

In FIG. 15, the cutout 64 is formed on the top and bottom edges of the printed wiring board 16 (17). Also, there are LEDs 65 for display and a switch 66 in the front area of the printed wiring board 16 (17).

Figure 16:
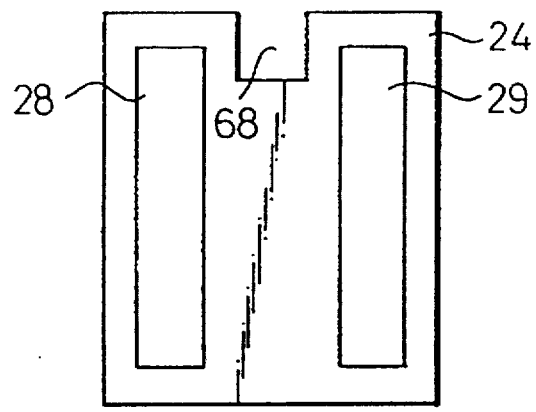
FIG. 16 is a side view of one example of the mother board having an opening.
Figure 17:
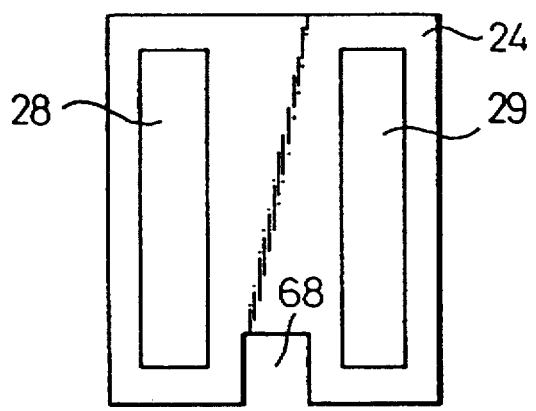
FIG. 17 is a side view of another example of the mother board having an opening.
Figure 18:
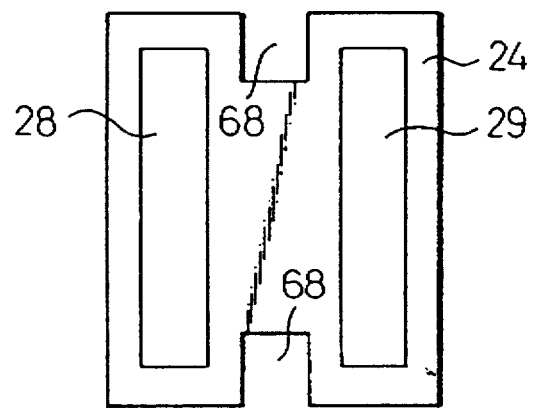
FIG. 18 is a side view of a further example of the mother board having an opening.

FIGS. 16 to 18 illustrate a cutout 68 formed on the mother board 24 used as a supporting plate, for allowing a cooling air to pass therethrough. The cutout is provided at a position between the connectors 28, 29 to be connected to the connectors 38, 39 on the printed wiring boards 16 and 17.

In FIG. 16, the cutout 68 is formed on the top edge of the mother board 24.

In FIG. 17, the cutout 68 is formed on the bottom edge of the mother board 24.

In FIG. 18, the cutout 68 is formed on the top and bottom edges of the mother board 24.

Figure 19:
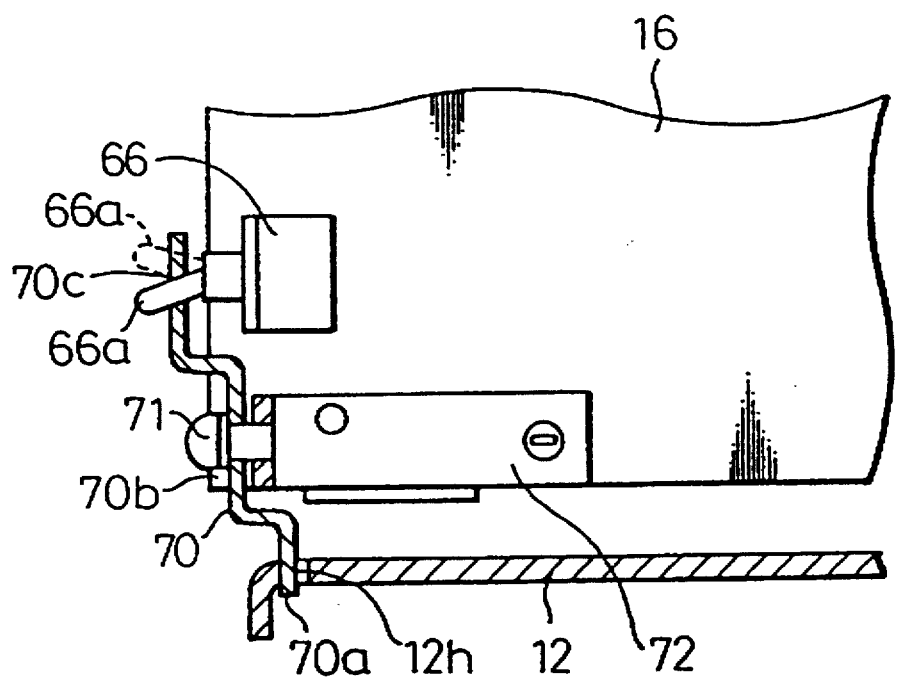
FIG. 19 is a cross-sectional view of one example of the printed wiring board having a locking member.

FIG. 19 illustrates an example of the printed wiring board 16 (17) having a locking member 70. The locking member 70 is adapted to associate with the switch 66 provided in the front area of the printed wiring board 16 (17). The switch 66 is used, for example, for issuing a signal representing the detachment of the printed wiring board 16 (17) to the data storing device body. The switch 66 in FIG. 19 is a toggle switch with an actuating piece 66a.

Figure 20:
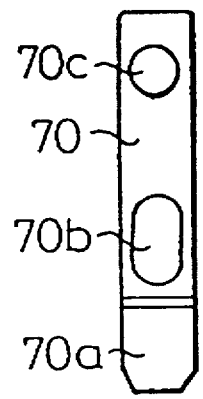
FIG. 20 is a front view of the locking member of FIG. 19.

As shown in FIGS. 19 and 20, the locking member 70 comprises a bent plate member, in which a locking part 70a formed at the lower end of the plate is insertable into a locking aperture 12h provided in the housing 12. An elongated aperture 70b is formed in the middle area of the locking member 70, through which a guide screw 71 is inserted. A bracket 72 formed by a plate member is fixed to the printed wiring board 16 (17) and the guide screw 71 is threaded to a vertically bent part of the bracket 72. In addition, there is a circular aperture 70c in the upper end portion of the locking member 70, through which the actuating piece 66a of the switch 66 is inserted.

Therefore, the locking member 70 is driven by the operation of the actuating piece 66a of the switch 66 in the upward or downward direction while being guided by the guide screw 71 engaged with the elongated aperture 70b. In FIG. 19, when the printed wiring board 16 (17) is inserted in the housing 12 and is in the operative condition, the actuating piece 66a of the switch 66 occupies a lower position so that the locking part 70a is engaged in the locking aperture 12h to maintain the locked condition. To remove the printed wiring board 16 (17) from the housing 12, the actuating piece 66a of the switch 66 is moved to the upper position, as shown by a dotted line in FIG. 19. The locking member 70 thus moves upward so that the locking part 70a of the locking member 70 is removed from the locking aperture 12h of the housing 12. Thus the locked condition is released and the printed wiring board 16 (17) can be detached from the housing 12. In this case, the removal of the printed wiring board 16 (17) does not influence the other active components because the removal is carried out after the switch 66 has been turned off.

Figure 21:
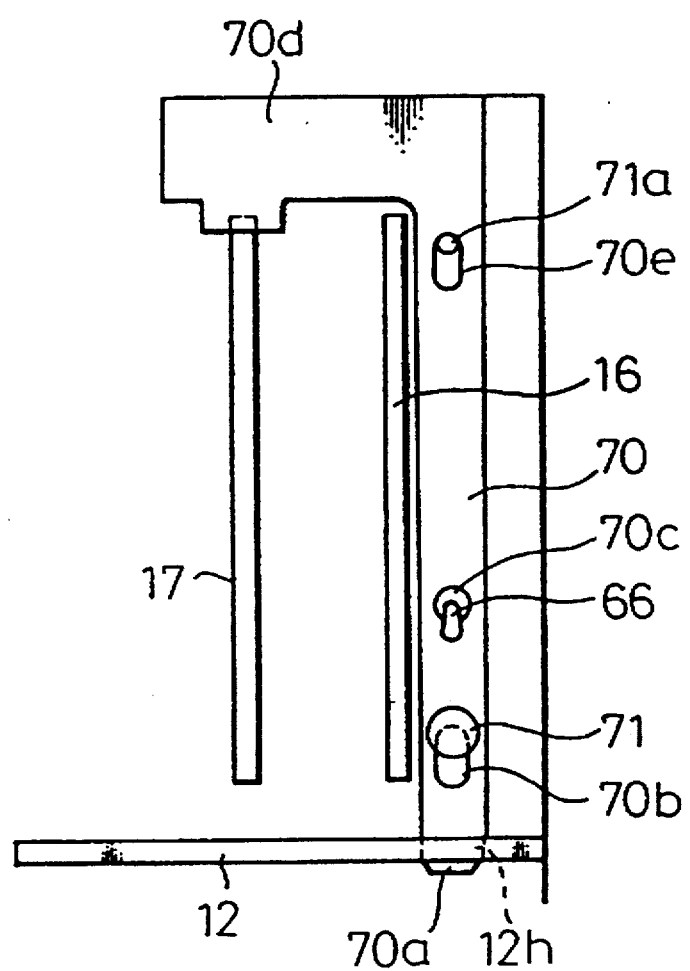
FIG. 21 is a front view of another example of the printed wiring board having a locking member.

FIG. 21 illustrates another example of the printed wiring board 16 having a locking member 70. This locking member 70 is similar to the locking member 70 shown in FIG. 19, and has a locking part 70a insertable into a locking aperture 12h of the housing 12, an elongated aperture 70b engageable with a guide screw 71 supported on the printed wiring board 16, and a circular aperture 70c engageable with an actuating piece 66a of a switch 66. Further, the locking member 70 has an upper extension 70d extending to an area in front of the other printed wiring board 17 for locking the latter too. In this regard, the locking member 70 has another elongated aperture 70e engageable with another guide screw 71a. According to this example, it is possible to simultaneously lock both printed wiring boards 16 and 17 by only one switch 66. In some cases, the upper extension 70d may be used for locking the disk drive unit 14 too.

Figure 22:
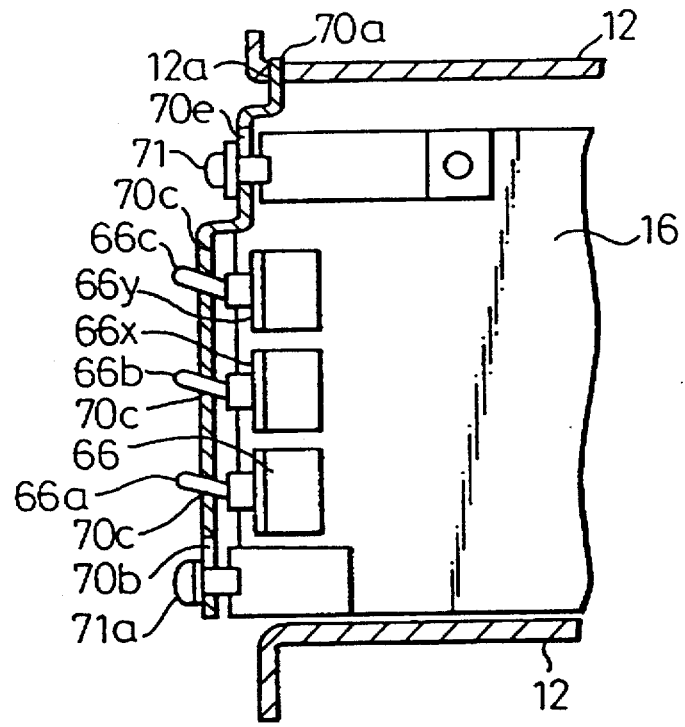
FIG. 22 is a cross-sectional view of a further example of the printed wiring board having a locking member.

FIG. 22 illustrates a further example of the printed wiring board 16 having a locking member 70. This locking member 70 has a locking part 70a insertable into a locking aperture 12h of the housing 12 and elongated apertures 70b and 70e engagable with guide screws 71 and 71a, respectively, supported on the printed wiring board 16. In this example, three switches 66, 66x and 66y are arranged in a vertical row for engagement with the locking member 70. Actuating pieces 66a, 66b and 66c of the switches 66, 66x and 66y are inserted into circular apertures 70c of the locking member 70, respectively. Therefore, in this example, the locking member 70 is not releaseable unless all the switches 66, 66x and 66y are operated. Also, it is possible to arrange the lock so that the lock can be released by operating any one of the switches 66, 66x and 66y, by arranging the locking part in the lower position.

Figure 23:
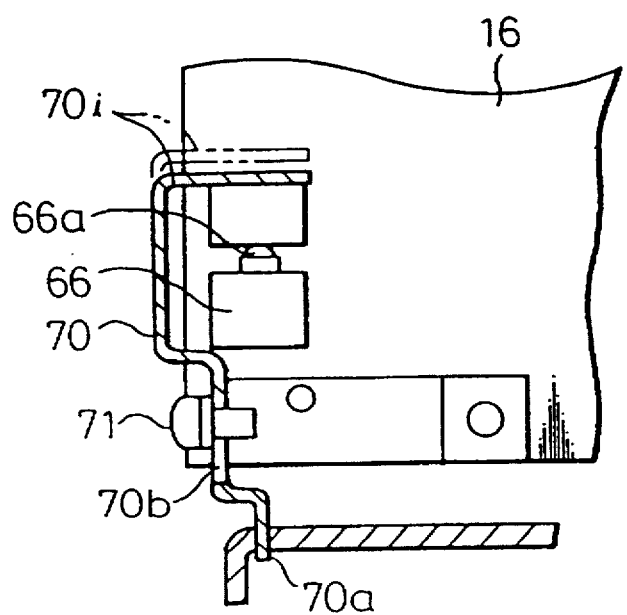
FIG. 23 is a cross-sectional view of a further example of the printed wiring board having the locking member.

FIG. 23 illustrates a still further example of the printed wiring board 16 having a locking member 70. This example differs from that shown in FIG. 19 in that a switch 66 is of a push-button type. The locking member 70 has a locking part 70a insertable into a locking aperture 12h of the housing 12, an elongated aperture 70b engagable with a guide screw 71 supported on the printed wiring board 16, and a pressing part 70i engagable with an actuating piece 66 a of the switch 66. Once the actuating piece 66 a is pushed, the lock is established, as shown in FIG. 23. The actuating piece 66 a of the switch 66 is raised by another push thereof and forces the pressing part 70i to a position shown by a dotted line, where the locking member is in the released condition.

Figure 24:
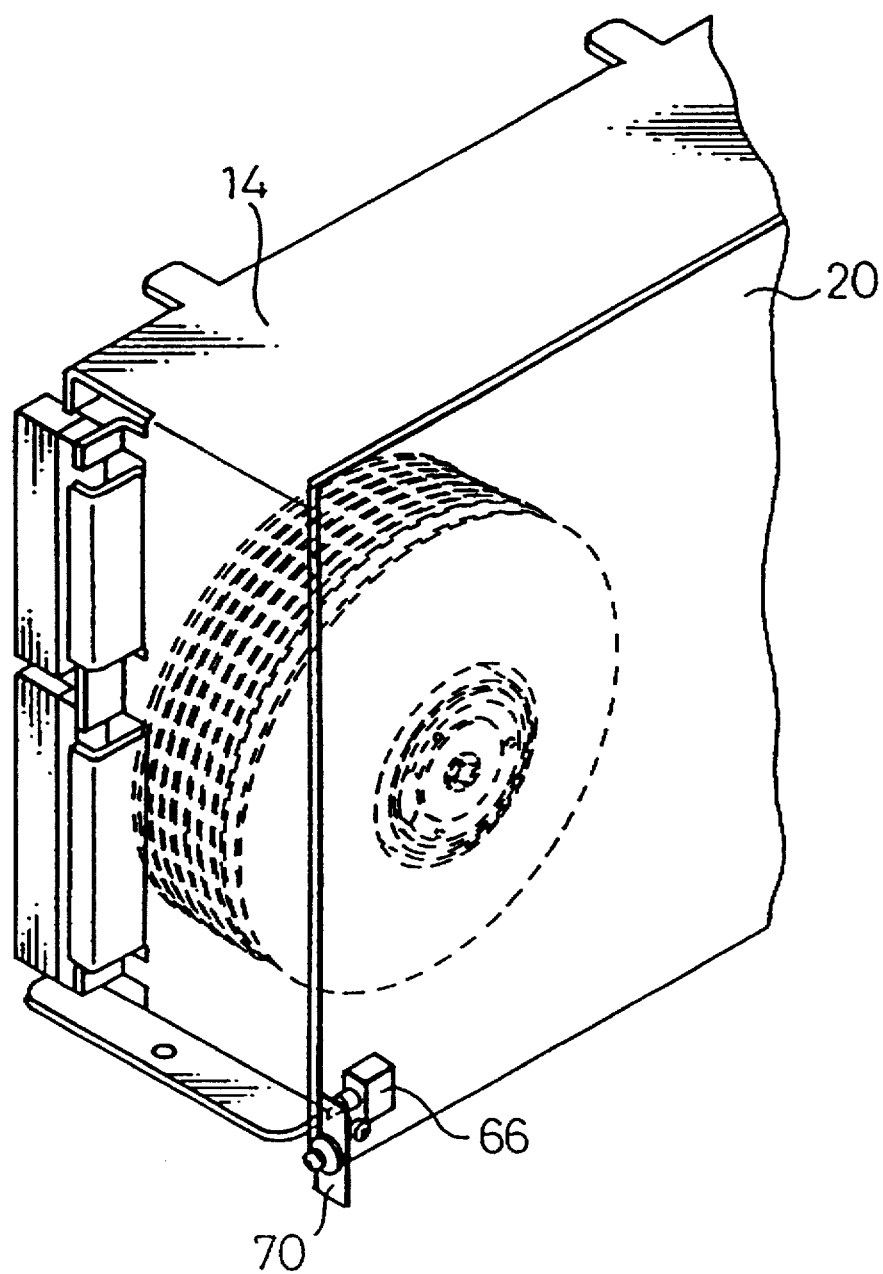
FIG. 24 is a cross-sectional view of a still further example of the printed wiring board having a locking member.

FIG. 24 illustrates an example of the disk drive unit 14 having a locking member 70. A printed wiring board 20 is secured to the disk drive unit 14, and the switch 66 and the locking member 70 are attached to the printed wiring board 20. The switch 66 and the locking member 70 may be of the same structure as those of FIGS. 19 and 23.

Figure 25:
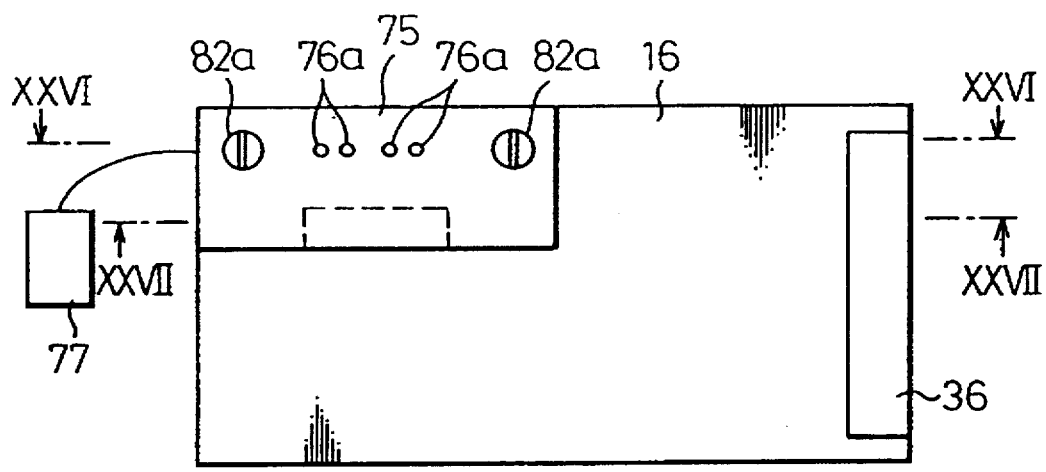
FIG. 25 is a plan view of a printed wiring board having an additional printed wiring board.
Figure 26:
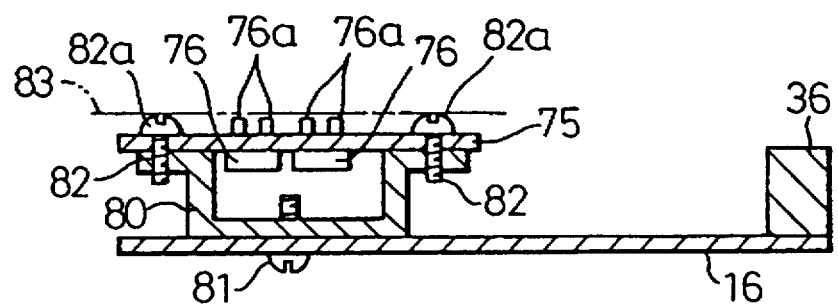
FIG. 26 is a cross-sectional view of the printed wiring board taken along the line XXVI—XXVI in FIG. 25.
Figure 27:
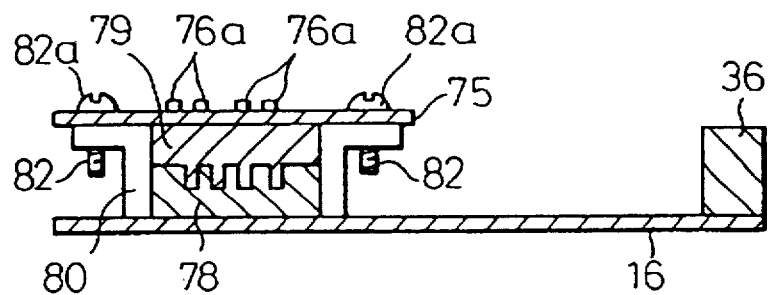
FIG. 27 is a cross-sectional view of the printed wiring board taken along the line XXVII—XXVII in FIG. 25.

FIGS. 25 to 27 illustrate an example of a printed wiring board assembly including a printed wiring board 16 (hereinafter referred to as a parent printed wiring board) and an additional printed wiring board 75. The additional printed wiring board 75 is provided with LSIs 76 functioning as memory. LSIs 76 are formed from DIP type semiconductor packages or the like and have terminals 76a. The LSIs 76 are connected to a cell 77 so that the content of the memory can be maintained even if the parent printed wiring board 16 is detached from the housing 12 and the additional printed wiring board 75 is removed from the parent printed wiring board 16. However, if the removed additional printed wiring board 75 is placed on a flat conductor, there is a risk in that the terminals 76a are brought into a short-circuit and the content of the memory is lost. Accordingly, it is necessary to avoid the formation of a short-circuit of the terminals 76a when the additional printed wiring board 75 is placed on the flat conductor.

The parent printed wiring board 16 and the additional printed wiring board 75 are disposed such that the mounting surfaces of the parent and additional printed wiring board 16 and 75 are opposed to each other. Then the plug-in connection is made between a connector 78 on the parent printed wiring board 16 and a connector 79 on the additional printed wiring board 75. When the additional printed wiring board 75 is attached to the parent printed wiring board 16, the LSIs 76 are on the inner surface of the additional printed wiring board 75 and the terminals 76a of the LSIs 76 project from the outer surface of the additional printed wiring board 75.

The additional printed wiring board 75 is secured to the parent printed wiring board 16 via a bent plate member 80. The plate member 80 is fixed to the parent printed wiring board 16 by a screw 81, and the additional printed wiring board 75 is fixed to the plate member 80 by two screws 82. In this regard, the screws 82 are positioned on an extension of a straight line passing through the terminals 76a of the LSIs 76, and the heads 82a of the screws 82 project higher than the terminals 76a of the LSIs 76. Accordingly, even if the additional printed wiring board 75 is placed on a flat conductor 83, as shown by an imaginary line in FIG. 26, the terminals 76a of the LSIs 76 are not brought into contact with the flat conductor 83 and a short-circuit is prevented. While the screw head 82a is used for preventing a formation of a short-circuit in the above embodiment, it is possible to use other higher projections in place of the screws.

Figure 28:
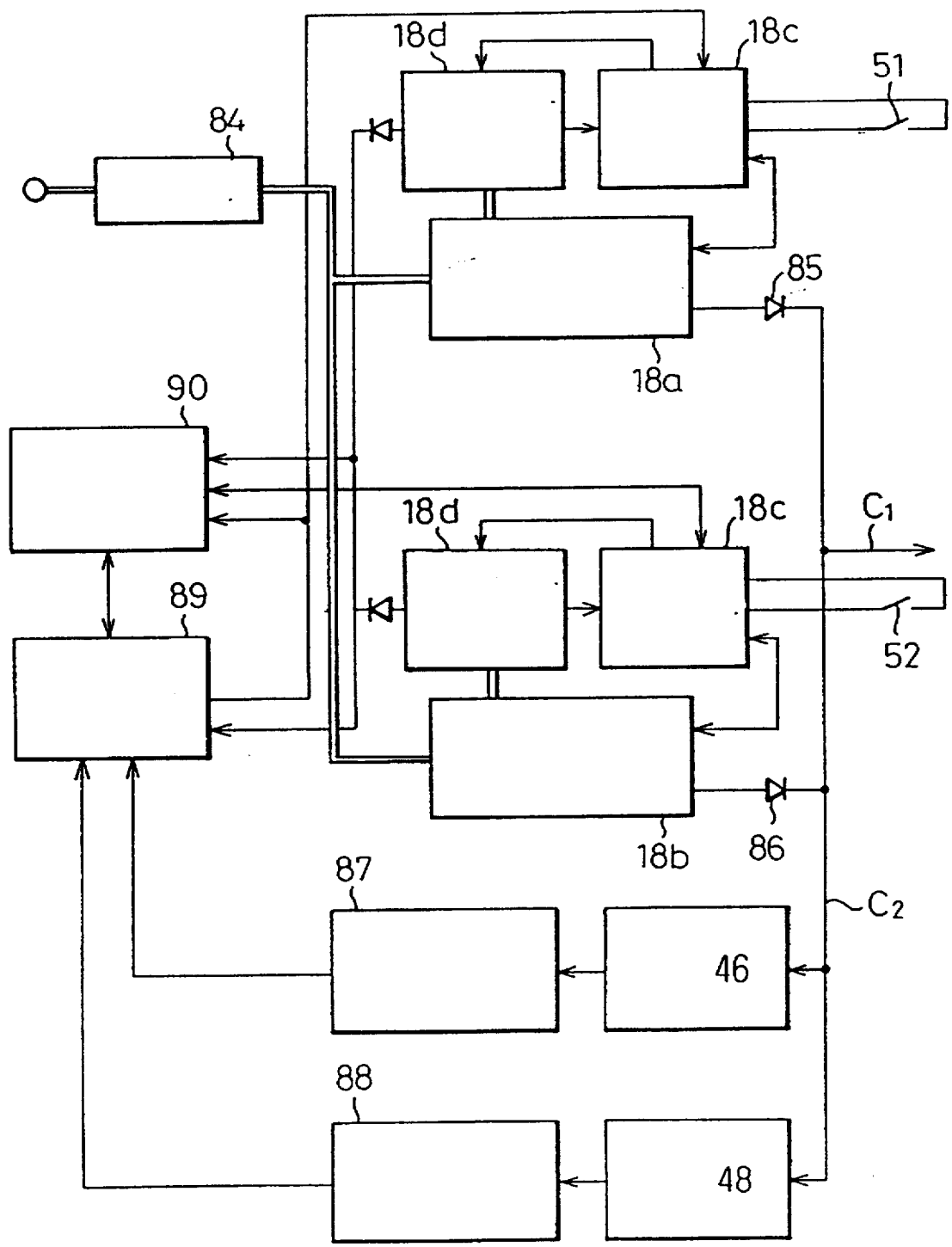
FIG. 28 is a block diagram illustrating a power supply unit including converters having a redundant structure.

FIG. 28 illustrates an example of the power supply unit 18 when two cooling fans 46, 48 are provided in the housing. In this case, one cooling fan 46 is arranged on the front side of the power supply unit 18 and the other cooling fan 48 is arranged on the rear side of the power supply unit 18, as showing in FIG. 2. The cooling fan 48 on the rear side of the power supply unit 18 can be removed from the rear end of the housing 12, while the housing 12 is engaged in the cabinet 1 and the disk drive units 14 and 15 are in the operative condition, as described with reference to FIG. 10. The cooling fan 48 can be removed from the opening 4 of the cabinet 1 and repaired or replaced by a normal one by inserting it again in the housing 12 while the latter remains in the cabinet 1.

In FIG. 28, the power supply unit 18 comprises first and second AC-DC converters 18a and 18b in a redundant structure. The first and second converters 18a and 18b are adapted to convert an alternating current supplied via a filter 84 into a direct current, and each converter includes a control circuit 18c and constant power source 18d. As shown in FIGS. 10, and 28 the enable/disable switches 51 and 52 are provided on the rear end of the housing 12, see FIG. 10 and connected to the control circuits 18c of the first and second converters 18a and 18b, respectively see FIG. 28.

The first and second converters 18a and 18b are connected to the disk drive units 14 and 15 and the printed wiring boards 16 and 17 by a line $C_1$ via diodes 85 and 86, and to the cooling fans 46 and 48 by a line $C_2$. Even if either one of the first and second converters 18a and 18b is abnormal, it is possible to drive the disk drive units 14 and 15, the printed wiring boards 16 and 17, and the cooling fans 46 and 48 by the remaining normal converter alone. When one of the first and second converters 18a and 18b fails to function, the associated enable/disable switch 51 and 52 should be pushed to separate the failing converter from the controller in the data storing device body so that the repair can be carried out. If the converter is restored to a normal condition, the associated enable/disable switch 51 or 52 is pushed to recover the operation thereof. When either one of the first and second converters 18a, 18b is broken and the associated enable/disable switch 51 or 52 is pushed, it is also possible to regulate the voltage of the single operating converter.

Alarm circuits 87 and 88 are provided for the cooling fans 47, 48. If the rotational speed of the cooling fan 46 or 48 falls to a certain value, an alarm signal is transmitted to the alarm circuit 87 or 88 to generate an alarm. Also the alarm signal is transmitted to a common control part 89, to which a signal from the enable/disable switch 51 or 52 is also transmitted. The common control part 89 and the other circuits are connected to a computer via an I/O port 90.

Figure 29:
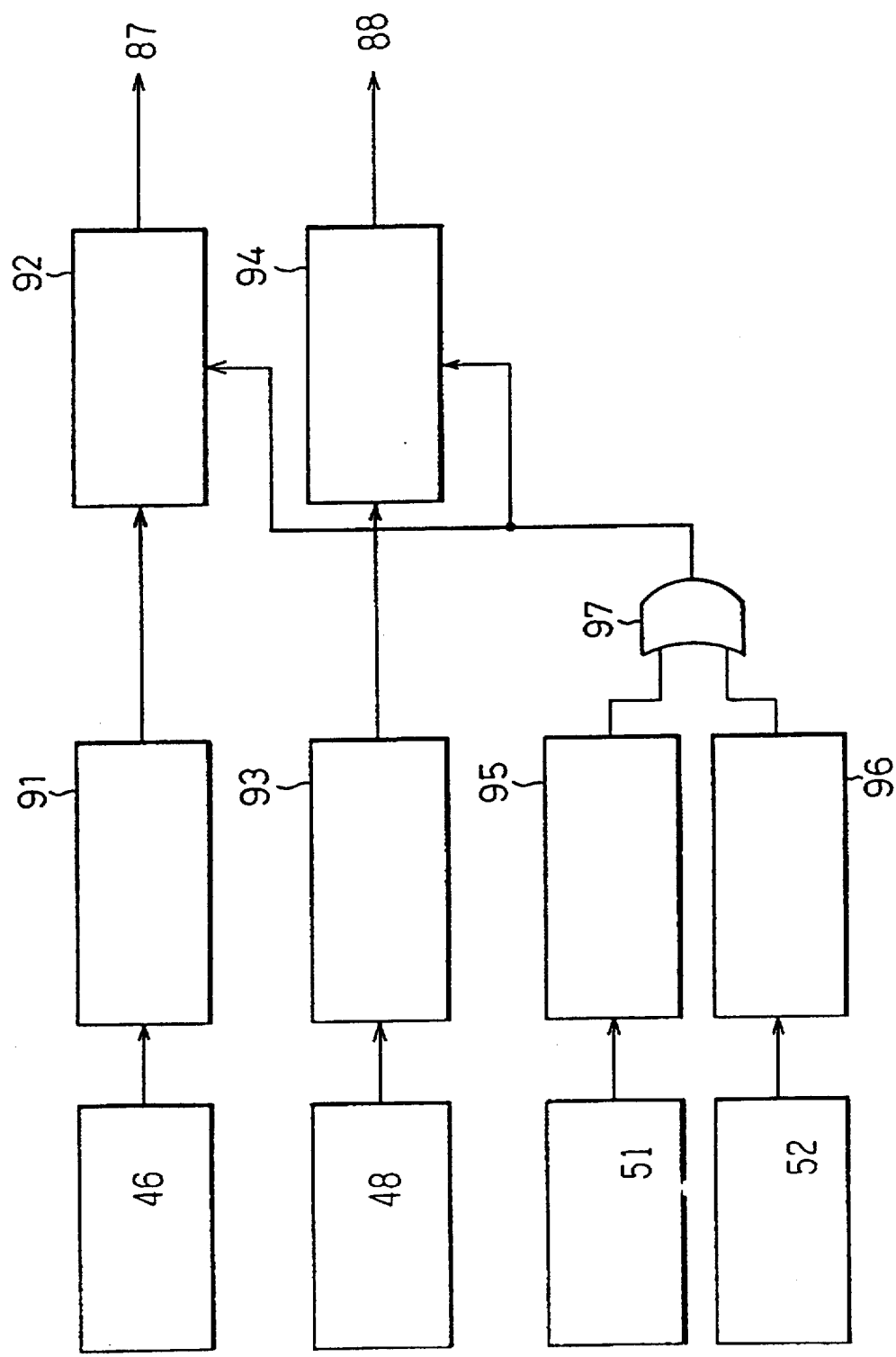
FIG. 29 is a block diagram illustrating the cooling fan alarm system.

FIG. 29 is a block diagram of the alarm system for the cooling fans in FIG. 28. The rotational speed of the cooling fan 46 is detected by a rotational speed detecting circuit 91 which issues an alarm signal if it detects the abnormality of the cooling fan 46 by a full of the rotational speed thereof to below a certain value. The alarm signal is transmitted to the alarm circuit 87 via an alarm latch circuit 92. Similarly, the rotational speed of the cooling fan 48 is detected by a rotational speed detecting circuit 93 which issues an alarm signal if it detects the abnormality of the cooling fan 48 by a fall of the rotational speed thereof to below a certain value. The alarm signal is transmitted to the alarm circuit 88 via an alarm latch circuit 94.

The enable/disable switch 51 is connected to a disable pulse generating circuit 95, and the enable/disable switch 52 is connected to a disable pulse generating circuit 96. The disable pulse generating circuits 95 and 96 transmit clear signals to the alarm latch circuits 92, 94 via an OR gate 97.

Figure 30:
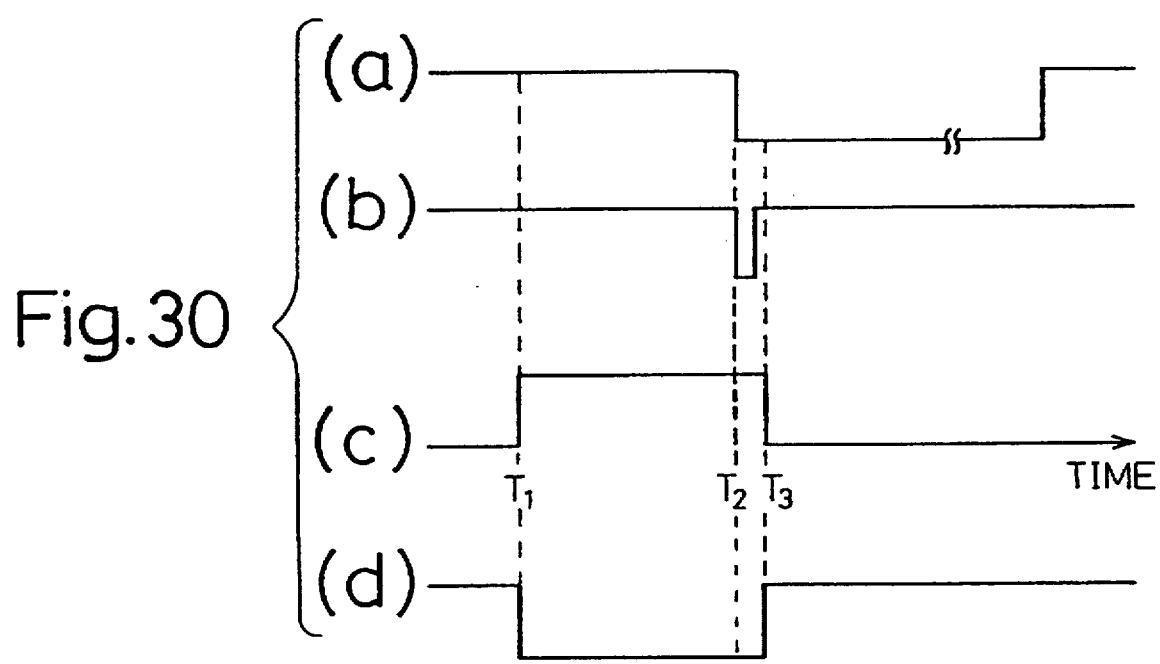
FIG. 30 is a view illustrating voltage waveform of the E/D switch, the disable pulse, the alarm signal, and the fan, used for releasing the alarm signals in FIGS. 28 and 29.

FIG. 30 illustrates voltage waveforms of (a) the E/D switch 51 or 52, (b) the disable pulse, (c) the alarm signal, and (d) the fan, used for releasing the alarm signals in FIGS. 28 and 29. If an abnormality occurs in either one of the cooling fans 46, 48, the alarm circuit 87 issues an alarm at the time $T_1$ to stop the supply of power supply to the cooling fan. The operator can thus repair or replace the abnormal cooling fan 46 or 48. When the operator pushes either one of the enable/disable switches 51 and 52 at the time $T_2$, as shown in the waveform (a), the associated disable pulse generating circuit 95, 96 issues a disable pulse as shown in the waveform (b). The OR gate 97 thus issues an alarm clear signal due to the fall of the disable pulse at the alarm latch circuit 94, as shown in the waveform (c). Accordingly, the alarm in the alarm circuit 87 or 88 is released whereby the supply of power to the cooling fan is restarted. The operator returns the pushed enable/disable switch 51, 52 to the original position. A period required for the repair or replacement of the broken fan is shown in the waveform (d).

In FIGS. 28 and 29, the enable/disable switches 51 and 52 are used for clearing the alarm. The enable/disable switches 51, 52 are arranged to cooperate with the first and second converters 18a, 18a, respectively. It is possible to use a further switch exclusively for clearing the alarm, but it is possible to omit such a further switch by utilizing the enable/disable switches 51 and 52 for this purpose. In addition, when the enable/disable switch 51 or 52 is pushed for clearing the alarm, it is possible to regulate the voltage of the other (operating) converter, as described above.

Figure 31:
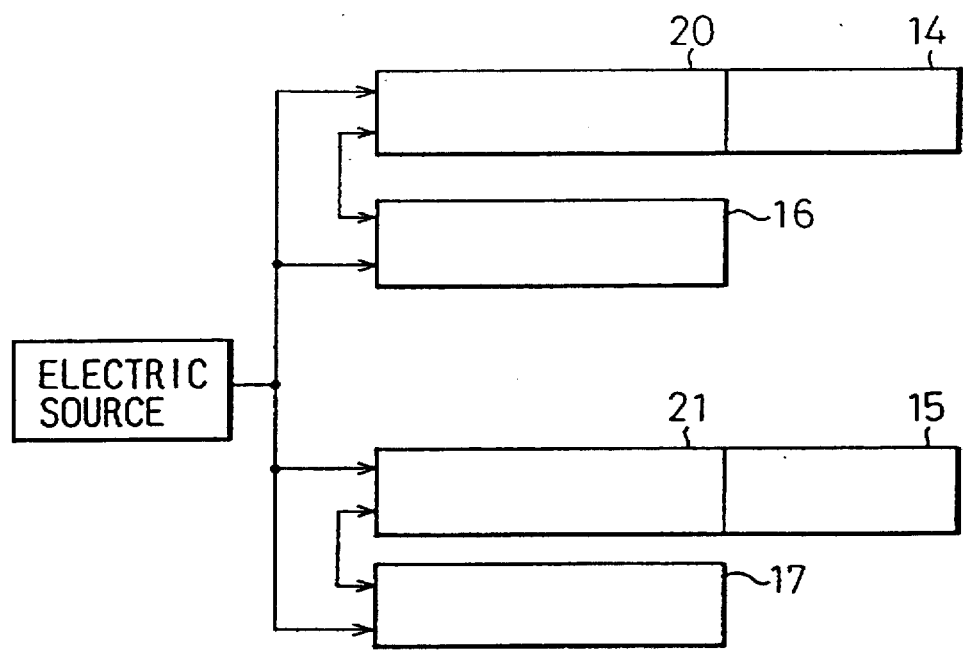
FIG. 31 is a view illustrating one example having two printed wiring boards for one disk drive unit.

FIG. 31 illustrates an arrangement similar to that of FIGS. 2 and 3; there are the disk drive units 14, 15 and the printed wiring boards 16, 17 as well as further printed wiring boards 20, 21 fixed to the disk drive units 14, 15, respectively. Accordingly, there are two printed wiring boards 16 and 20 for one disk drive unit 14, and there are two printed wiring boards 17 and 21 for the other disk drive unit 15.

For each of the disk drive units (DDU) 14 and 15, the first printed wiring board (PWB) 16 or 17 includes digital logic mainly for providing an interface between the disk drive unit and the data storing device body and the second printed wiring board 20 or 21 includes analog logic mainly for controlling the disk drive unit 14 or 15.

When a plurality of printed wiring boards 16 and 20 (17 and 21) are provided for one disk drive unit 14 (15), there is a possibility that when one of the printed wiring boards is removed while the other printed wiring board is active, the latter may become abnormal. Therefore, when one printed wiring board is removed, it is preferable to simultaneously reset the other printed wiring board.

Figure 32:
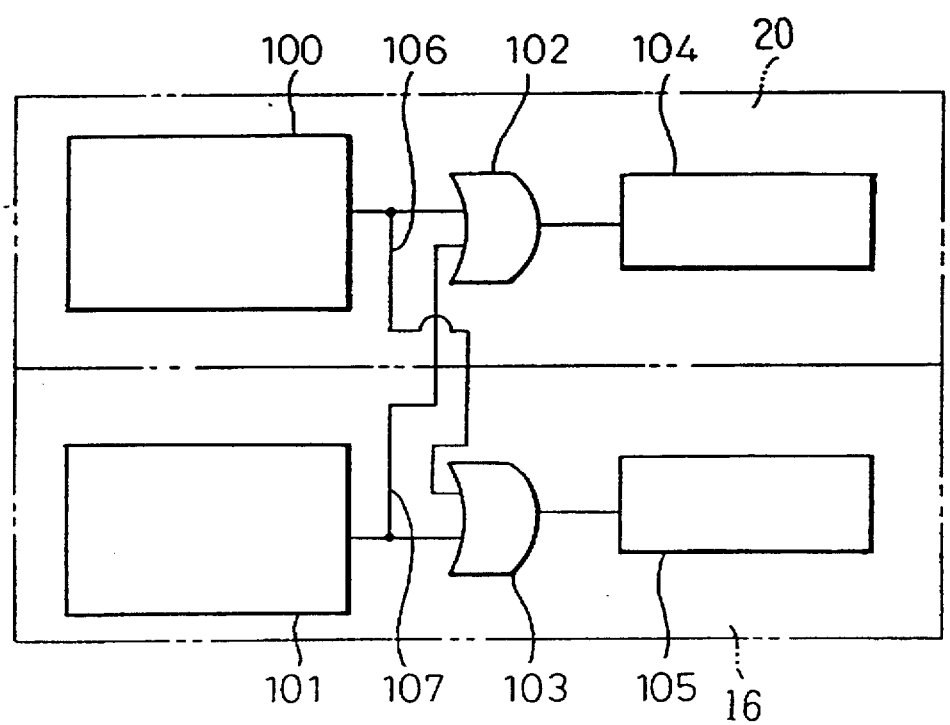
FIG. 32 is a view illustrating the reset circuit for two printed wiring boards.

FIG. 32 illustrates an example of a reset circuit used when a plurality of printed wiring boards are provided for one disk drive unit. FIG. 32 shows that the first printed wiring board 16 and the second printed wiring board 20 are provided for one disk drive unit 14, and that voltage detecting circuits 100 and 101 are provided in the printed wiring boards, respectively. The voltage detecting circuits 100, 101 are connected to OR gates 102 and 103, which are connected to control circuits 104, 105, respectively.

The voltage detecting circuits 100 and 101 have a power reset (PWRST) function, respectively. The voltage detecting circuit 100 is connected to its own OR gate 102 and also to the OR gate 103 of the other voltage detecting circuit 101 via a circuit 106. Similarly, the voltage detecting circuit 101 is connected to its own OR gate 103 and also to the other OR gate 102 via a circuit 107. Accordingly, for the disk drive unit 14, if either one of the printed wiring boards 16 and 20 is removed, the other printed wiring board 20 or 16 can be simultaneously reset.

Figure 33:
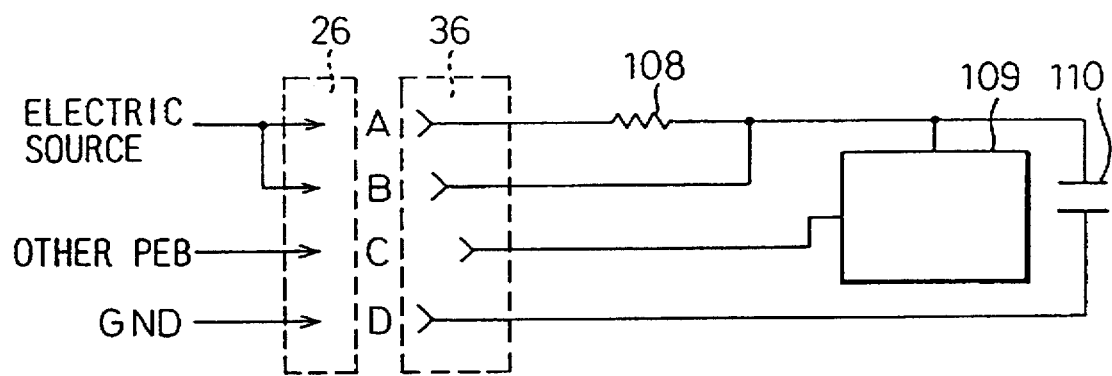
FIG. 33 is a view illustrating the arrangement of connectors in the reset circuit.

FIG. 33 illustrates terminals A, B, C and D of the connectors 26 and 36 used for resetting the printed wiring board 20 (16). As described before, the disk drive unit 14 (therefore, the printed wiring board 20) has a connector 36 connected to the connector 28 of the mother board 24. These connectors 36 and 26 have their respective terminals A, B, C and D mutually connected. The terminal A of the connector 26 is connected to the power supply line and the terminal D is connected to the ground line. The terminals A and D of the connector 36 are connected to the power supply terminal and the ground terminal, respectively, of the reset circuit 109. The reset circuit 109 corresponds to a portion of the arrangement in FIG. 32. Further, a resistor 108 is arranged between the terminal A of the connector 36 and the reset circuit 109 and a capacitor 110 is arranged in parallel to the reset circuit 109. The terminal B of the connector 36 is branched from the power supply line, and the terminal B of the connector 26 is connected to the power supply line between the resistor 108 and the reset circuit 109. The terminal C of the connector 26 is connected to the reset circuit of the other printed wiring board 20, and the terminal C of the connector 36 is connected to the reset circuit 109.

In addition, the terminals A, B, C and D of the connectors 26 and 36 have male type projections or female type recesses with different heights or depths, so that the mutual terminals A and D are mutually engageable at the first stage of the coupling between the connectors 36 and 26, the terminals B then mutually engage and finally, the terminals C mutually engage.

Figure 34:
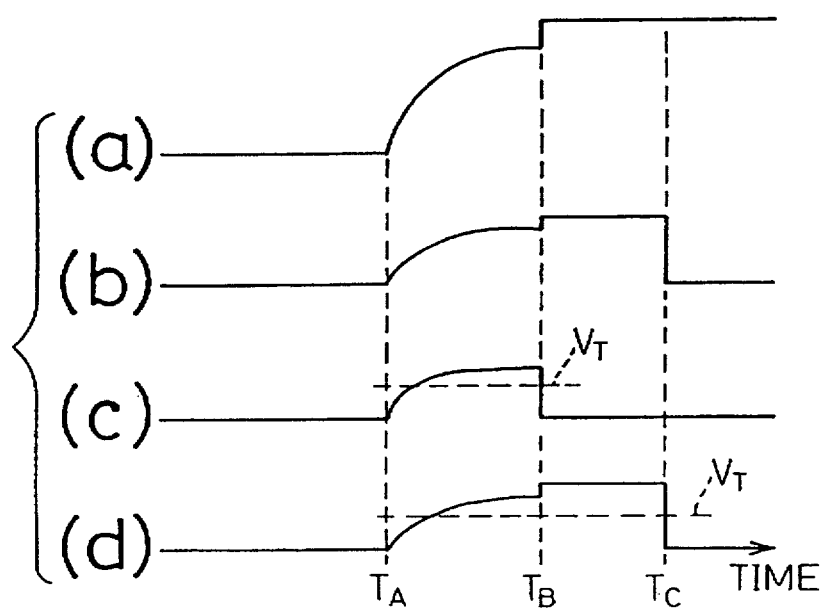
FIG. 34 is a view illustrating the voltage waveform of the source, the first and second printed wiring boards, and the OR gate.

FIG. 34 illustrates the voltage waveforms of (a) the power supply input to the reset circuit 109, (b) the first wiring board 16, (c) the second printed wiring board 20, and (d) the OR gate 102. Here, it is assumed that the first printed wiring board 16 has already been connected to the associated connector and the second printed wiring board 20 is now connected to the associated connector. Since the resistance 108 and the capacitor 110 are inserted in the source line, the rise of the source voltage is moderate when the terminals A and D are mutually engaged at the initial stage of the coupling between the connectors 36 and 26 (at the time $T_A$). When the terminals B are mutually engaged (at the time $T_B$), the input source voltage abruptly rises to a predetermined level because the current flows, bypassing the resistor 108.

The waveform (b) shows a reset voltage appearing on the terminal C connected to the first printed wiring board 16, and the waveform (c) shows a reset voltage appearing on the second printed wiring board 20. The reset voltage of the second printed wiring board 20 shown in (c) rises at the time $T_A$, similarly to the input source voltage shown at (a) and the resetting is finished when the source voltage reaches the predetermined value at the time $T_B$. When the reset voltage exceeds the threshold voltage ($V_T$), a power reset is conducted. While this reset voltage is also supplied to the first printed wiring boards 16, the resetting operation of the other printed wiring board 16 has been already completed, whereby there is no influence on the first printed wiring board 16.

After the connection of the first printed wiring board 16 (carried out previously at a time corresponding to the time $T_B$), the reset voltage of the first printed wiring board 16 becomes zero. The circuits 106 and 107 are connected to 5 volt power supply via a pull-up resistor (not shown), respectively, whereby the reset voltage appears at the terminal C in accordance with the rise of the voltage of the second printed wiring board 20 and is cleared at the time $T_C$ as shown in (b). This reset voltage is input to the OR gate 102, whereby an output voltage of the OR gate 102 appears, as shown in (d). As a result, the power reset is conducted in the second printed wiring board 20, while the output voltage of the OR gate 102 is maintained higher than the threshold voltage ($V_T$), until the time $T_C$.

For example, when the second printed wiring board 20 is removed while the first printed wiring board 16 is still maintained in the housing 12 in the connected condition, a reset voltage similar to that shown in FIG. 34 appears, in a reverse sequence. Accordingly, when the second printed wiring board 20 is removed, the terminals C are disengaged at the time $T_c$ and the reset voltage appears as shown in (b). This reset voltage is supplied to the OR gate 103 of the first printed wiring board 16 so that a power reset of the first printed wiring board 16 is conducted. In the second printed wiring board 20, the power reset is conducted at the time $T_B$. Therefore, it is possible to avoid the unstable operation of LSIs in the first printed wiring board 16 when the second printed wiring board 20 is removed.

As explained in detail, according to the present invention, it is possible to easily attach and detach the disk drive unit or the printed wiring board from the housing thereof. Particularly, when one magnetic disk module comprises a plurality of sets of disk drive units and printed wiring boards, it is possible to easily attach and detach the disk drive unit or the printed wiring board in one set while the disk drive unit and the printed wiring board in the other set are in an operating condition.

We claim:

1. A magnetic disk module adapted to be inserted in a data storing device body which is in use, said module comprising:

a housing having a front end and a rear end;

at least one disk-drive unit accommodated in the housing and having a first connector;

at least one printed wiring board accommodated in the housing for controlling the at least one disk-drive unit and having a second connector;

a power supply unit accommodated in the housing;

a third connector arranged at the rear end of the housing for plug-in connection to a connector of a data storing device body when the magnetic disk module is inserted into the data storing device body;

a fourth connector arranged in the housing for plug-in connection to the first connector when the disk-drive unit is inserted in the housing;

a fifth connector arranged in the housing for plug-in connection to the second connector when the printed wiring board is inserted in the housing; and a supporting plate disposed in the housing so as to extend transversely to a longitudinal direction of the housing, the disk drive unit and the printed wiring board being arranged on the side of the front end of the housing from the supporting plate, the power supply unit arranged on the side of the rear end of the housing from the supporting plate, the fourth and fifth connectors being mounted to the supporting plate.

2. A magnetic disk module as defined by claim 1, wherein at least two disk drive units and at least two printed wiring boards are arranged in the housing so as to extend, parallel to each other, in the longitudinal direction of the housing from the supporting plate.

3. A magnetic disk module as defined by claim 2, wherein the disk drive unit includes a further printed wiring board attached thereto.

4. A magnetic disk module as defined by claim 2, further comprising at least one cooling fan in the housing, the supporting plate having an opening for allowing cooling air to pass therethrough.

5. A printed magnetic disk module as defined by claim 2, wherein the disk drive unit is controlled by said at least two wiring boards, and when one of the printed wiring boards is removed from the housing, the remaining printed wiring board is reset.

6. A magnetic disk module as defined by claim 4, wherein two cooling fans are arranged in the housing, one of the fans being on the front side of the power supply unit and the other fan being on the rear side of the power supply unit.

7. A magnetic disk module as defined by claim 6, wherein each of two cooling fans is normally driven at a respectively predetermined rotational speed, and when the rotational speed of one of two cooling fans is lowered to a certain value, the other cooling fan is driven at a rotational speed higher than the predetermined rotational speed.

8. A magnetic disk module as defined by claim 4, wherein at least one of the at least two printed wiring boards has a notch for allowing cooling air to pass therethrough.

9. A magnetic disk module as defined by claim 4, wherein the supporting plate has an opening at a position between the at least two printed boards for allowing cooling air to pass therethrough.

10. A magnetic disk module as defined by claim 1, further comprising two cooling fans in the housing, one of the cooling fans being positioned on the front side of the power supply unit and the other being positioned on the rear side of the power supply unit, the power supply unit comprising first and second redundant AC-DC converters connected to the disk drive unit, the printed wiring board and the cooling fans.

11. A magnetic disk module as defined by claim 10, wherein the first and second converters are connected to the disk drive unit, the printed wiring board and the cooling fans via diodes.

12. A magnetic disk module as defined by claim 11, wherein the cooling fan positioned on the rear side of the power supply unit is detachable from the housing through the rear end thereof during the operation of the disk drive unit.

13. A magnetic disk module as defined by claim 11, further comprising detecting means for detecting the rotational speed of the cooling fans, and alarm means for generating an alarm when an abnormality in the cooling fans is detected.

14. A magnetic disk module as defined by claim 11, wherein the first and second converters are arranged so as to ensure the operation of the disk drive unit, the printed wiring board and the cooling fans if either one of the converters is subjected to a failure, and enable/disable switches are provided for electrically disconnecting the first and second converters from a controller of the data storing device body.

15. A magnetic disk module as defined by claim 14, further comprising detecting means for detecting the rotational speed of the cooling fans, and alarm means for generating an alarm when an abnormality in the cooling fans is detected, wherein the alarm is cancelled by operating the enable/disable switches.

16. A magnetic disk module adapted to be inserted in a data storing device body which is in use, said module comprising:

a housing having a front end and a rear end;

at least one disk-drive unit accommodated in the housing and having a first connector;

at least one printed wiring board accommodated in the housing for controlling the at least one disk-drive unit and having a second connector:

a power supply unit accommodated in the housing;

a third connector arranged at the rear end of the housing for plug-in connection to a connector of a data storing device body when the magnetic disk module is inserted into the data storing device body;

a fourth connector arranged in the housing for plug-in connection to the first connector when the disk-drive unit is inserted in the housing;

a fifth connector arranged in the housing for plug-in connection to the second connector when the printed wiring board is inserted in the housing; and a plurality of cooling fans in the housing, each of the cooling fans being normally driven at a respectively predetermined rotational speed, and when the rotational speed of one of the cooling fans falls to a certain value, at least one of the remaining cooling fans is driven at a rotational speed higher than the predetermined rotational speed.

17. A magnetic disk module adapted to be inserted in a data storing device body which is in use, said module comprising:

a housing having a front end and a rear end;

at least one disk-drive unit accommodated in the housing and having a first connector;

at least one printed wiring board accommodated in the housing for controlling the at least one disk-drive unit and having a second connector;

a power supply unit accommodated in the housing;

a third connector arranged at the rear end of the housing for plug-in connection to a connector of a data storing device body when the magnetic disk module is inserted into the data storing device body;

a fourth connector arranged in the housings for plug-in connection to the first connector when the disk-drive unit is inserted in the housing; and a fifth connector arranged in the housing for plug-in connection to the second connector when the printed wiring board is inserted in the housing;

wherein the first through fifth connectors comprise one of a male connector having projections and a female connector having recesses, respectively, the projections or recesses in the respective connector having different lengths so that a timing for the connection to the power supply unit and that for the connection to a signal do not coincide with each other.

18. A magnetic disk module adapted to be inserted in a data storing device body which is in use, said module comprising:

a housing having a front end and a rear end;

at least one disk-drive unit accommodated in the housing and having a first connector;

at least one printed wiring board accommodated in the housing for controlling the at least one disk-drive unit and having a second connector;

a power supply unit accommodated in the housing;

a third connector arranged at the rear end of the housing for plug-in connection to a connector of a data storing device body when the magnetic disk module is inserted into the data storing device body;

a fourth connector arranged in the housing for plug-in connection to the first connector when the disk-drive unit is inserted in the housing; and a fifth connector arranged in the housing for plug-in connection to the second connector when the printed wiring board is inserted in the housing;

wherein at least one of the disk drive unit and the printed wiring board has a switch on the front end side thereof, and a lock means is provided for securing at least one of the disk drive unit and the printed wiring board to the housing, the switch and the lock means being associated with each other.

19. A magnetic disk module adapted to be inserted in a data storing device body which is in use, said module comprising:

a housing having a front end and a rear end;

at least one disk-drive unit accommodated in the housing and having a first connector;

at least one printed wiring board accommodated in the housing for controlling the at least one disk-drive unit and having a second connector;

a power supply unit accommodated in the housing;

a third connector arranged at the rear end of the housing for plug-in connection to a connector of a data storing device body when the magnetic disk module is inserted into the data storing device body;

a fourth connector arranged in the housing for plug-in connection to the first connector when the disk-drive unit is inserted in the housing; and a fifth connector arranged in the housing for plug-in connection to the second connector when the printed wiring board is inserted in the housing;

wherein the at least one printed wiring board has a second printed wiring board attached thereto, the second printed wiring board having an outer surface, terminals projecting from the outer surface of the second printed wiring board when the additional printed board is mounted to the at least one printed wiring board, and protrusions arranged on the outer surface of the second primed wiring board having a height higher than that of the terminals.

20. A magnetic disk module as defined by claim 19, wherein the additional printed wiring board is mounted to the first printed wiring board via a bent plate member, the additional printed wiring board being fixed to the plate member by screws so that heads of the screws constitute the protrusions having a height higher than that of the terminals.

21. A magnetic disk module as defined by claim 20, wherein the additional printed wiring board is detachable from the first printed wiring board while maintaining the connection thereof to the power supply.

22. A printed wiring board assembly comprising; a first primed wiring board; a second printed wiring board attached to the first primed wiring board; and a bent plate member for mounting the second printed wiring board to the first printed wiring board, the second printed wiring board having an outer surface, and terminals projecting from the outer surface of the second printed wiring board when the second printed board is mounted to the first printed wiring board, the second printed wiring board being fixed to the plate member by screws so that heads of the screws protrude higher than the terminals.

23. A printed wiring board assembly as defined by claim 22, wherein the second printed wiring board is detachable from the first printed wiring board while maintaining the connection thereof to the power source.

24. A magnetic disk module adapted to be inserted in a data storing device body which is in use, said module comprising:

a housing having a front end and rear end, the housing having a size adapted to accommodate therein one disk-drive unit having a predetermined size; and two disk-drive units each of which has a size corresponding to one half of the predetermined size of said one disk-drive unit, the disk-drive units being accommodated in the housing in parallel to each other so that each disk-drive unit can be inserted in the housing through the from end thereof and can be removed from the housing through the front end thereof independently of the other disk-drive unit while the other disk-drive unit is active.

25. A magnetic disk module as defined by claim 24, each of the disk-drive units having a first connector, the magnetic disk module further comprising:

- at least one printed wiring board accommodated in the housing for controlling each of the disk-drive units and having a second connector;
- a third connector arranged at the rear end of the housing for plug-in connection to a connector of a data storing device body when the magnetic disk module is inserted into the data storing device body;
- a fourth connector arranged in the housing for plug-in connection to the first connector of each of the disk-drive units-when the disk-drive unit is inserted in the housing; and
- a fifth connector arranged in the housing for plug-in connection to the second connector when the printed wiring board is inserted in the housing.

* * * * *

UNITED STATES PATENT AND TRADEMARK OFFICE
CERTIFICATE OF CORRECTION

PATENT NO. : 5,570,269
DATED : October 29, 1996
INVENTOR(S) : Korikawa et al.

It is certified that error appears in the above-indentified patent and that said Letters Patent is hereby corrected as shown below:

<u>On the Title Page</u>:

Under "[57] Abstract", line 4, delete "are" and insert --one--.

Column 1, line 15, after "board", insert --for--.

UNITED STATES PATENT AND TRADEMARK OFFICE
CERTIFICATE OF CORRECTION

PATENT NO. : 5,570,269
DATED : October 29, 1996
INVENTOR(S) : Korikawa et al.

It is certified that error appears in the above-indentified patent and that said Letters Patent is hereby corrected as shown below:

Column 1, line 19, after "connector", insert --in--.

Column 1, line 67, after "not", delete "be".

Column 6, line 66, delete "in" and insert --is--.

Column 7, line 9, delete "seed" and insert --speed--.

Column 7, line 31, delete "10" and insert a new paragraph.

UNITED STATES PATENT AND TRADEMARK OFFICE
CERTIFICATE OF CORRECTION

PATENT NO. : 5,570,269
DATED : October 29, 1996
INVENTOR(S) : Korikawa et al.

It is certified that error appears in the above-indentified patent and that said Letters Patent is hereby corrected as shown below:

Column 11, line 45, delete "ØR" and insert --OR--.

Column 11, line 52, delete "ØR" and insert --OR--.

Column 12, line 52, delete "resistor" and insert --resistors--.

Column 16, line 37, delete "primed" and insert --printed--.

UNITED STATES PATENT AND TRADEMARK OFFICE
CERTIFICATE OF CORRECTION

PATENT NO. : 5,570,269
DATED : October 29, 1996
INVENTOR(S) : Korikawa et al.

It is certified that error appears in the above-indentified patent and that said Letters Patent is hereby corrected as shown below:

Column 16, line 38, delete "primed" and insert --printed--.

Column 16, line 64, delete "from end" and insert --front end--.

Signed and Sealed this

Second Day of September, 1997

*Attest:*

BRUCE LEHMAN

*Attesting Officer*  Commissioner of Patents and Trademarks